United States Patent
Popovac et al.

(10) Patent No.: US 11,917,375 B2
(45) Date of Patent: Feb. 27, 2024

(54) PROSTHESIS FUNCTIONALITY CONTROL AND DATA PRESENTATION

(71) Applicant: Cochlear Limited, Macquarie University (AU)

(72) Inventors: Ivana Popovac, Macquarie University (AU); Victor Manuel Rodrigues, Macquarie University (AU); Rishubh Verma, Macquarie University (AU); Kenneth Oplinger, Macquarie University (AU); Jan Patrick Frieding, Macquarie University (AU); Adam Schindhelm, Macquarie University (AU)

(73) Assignee: Cochlear Limited, Macquarie University (AU)

( * ) Notice: Subject to any disclaimer, the term of this patent is extended or adjusted under 35 U.S.C. 154(b) by 484 days.

(21) Appl. No.: 16/800,170

(22) Filed: Feb. 25, 2020

(65) Prior Publication Data

US 2020/0267481 A1 Aug. 20, 2020

Related U.S. Application Data

(62) Division of application No. 15/163,132, filed on May 24, 2016, now Pat. No. 10,575,108.

(Continued)

(51) Int. Cl.
*H04R 25/00* (2006.01)
*H04M 1/725* (2021.01)
(Continued)

(52) U.S. Cl.
CPC ...... *H04R 25/558* (2013.01); *H04M 1/72412* (2021.01); *H03G 1/02* (2013.01);
(Continued)

(58) Field of Classification Search
CPC .......... H04R 25/558; H04R 2225/0216; H04R 25/30; H04R 25/554; H04R 25/70;
(Continued)

(56) References Cited

U.S. PATENT DOCUMENTS 9,155,886 B2 * 10/2015 James ................ A61N 1/37247
2005/0201574 A1 9/2005 Lenhardt
(Continued)

FOREIGN PATENT DOCUMENTS

CN 104506586 A 4/2015
EP 2677771 A1 12/2013

OTHER PUBLICATIONS

International Search Report and Written Opinion for PCT/IB2016/055031, dated Nov. 21, 2016.
(Continued)

*Primary Examiner* — Erin M Piateski
(74) *Attorney, Agent, or Firm* — Pilloff Passino & Cosenza LLP; Martin J. Cosenza

(57) ABSTRACT

A portable body carried device, including a mobile computer having a display, wherein the portable body carried device is configured to receive data from a hearing prosthesis, such as a cochlear implant, and present an interface display on the display from among a plurality of different interface displays based on the received data.

30 Claims, 13 Drawing Sheets

Related U.S. Application Data

(60) Provisional application No. 62/208,944, filed on Aug. 24, 2015.

(51) Int. Cl.
*H04M 1/72412* (2021.01)
*H03G 1/02* (2006.01)
*H04M 1/60* (2006.01)
*H04M 1/72454* (2021.01)

(52) U.S. Cl.
CPC ...... *H04M 1/6066* (2013.01); *H04M 1/72454* (2021.01); *H04R 25/30* (2013.01); *H04R 25/554* (2013.01); *H04R 25/70* (2013.01); *H04R 2225/0216* (2019.05); *H04R 2225/55* (2013.01); *H04R 2225/67* (2013.01); *H04R 2430/01* (2013.01)

(58) Field of Classification Search
CPC ............ H04R 2225/55; H04R 2225/67; H04R 2430/01; H04M 1/72412; H04M 1/72454; H04M 1/6066; H03G 1/02
USPC .......................................................... 607/59
See application file for complete search history.

(56) References Cited

U.S. PATENT DOCUMENTS

| | | |
|---|---|---|
| 2009/0180631 A1 | 7/2009 | Michael et al. |
| 2009/0202084 A1 | 8/2009 | Joeng et al. |
| 2010/0254540 A1 | 10/2010 | Bang |
| 2011/0093039 A1* | 4/2011 | Van Den Heuvel ........................ A61N 1/36038 607/57 |
| 2011/0217930 A1 | 9/2011 | Jones et al. |
| 2012/0109006 A1* | 5/2012 | James ................ A61N 1/37247 600/559 |
| 2013/0004000 A1* | 1/2013 | Franck ................... H04R 25/70 381/314 |
| 2013/0329924 A1 | 12/2013 | Fleizach et al. |
| 2013/0343584 A1* | 12/2013 | Bennett ...................... A61J 1/00 381/317 |
| 2013/0343585 A1 | 12/2013 | Bennett et al. |
| 2014/0294183 A1 | 10/2014 | Lee et al. |
| 2015/0036851 A1 | 2/2015 | Howes |
| 2015/0124985 A1* | 5/2015 | Kim ...................... H04R 25/30 381/60 |
| 2016/0007128 A1* | 1/2016 | Roeck ................. H04R 25/554 381/60 |
| 2016/0038738 A1* | 2/2016 | Naylor ................. A61N 1/0541 607/57 |
| 2016/0360426 A1* | 12/2016 | Shaw ...................... H04W 4/30 |
| 2017/0064470 A1 | 3/2017 | Popovac et al. |
| 2017/0239475 A1* | 8/2017 | Koka ................. A61N 1/36039 |

OTHER PUBLICATIONS

Partial European Search Report for European Patent Application No. 16 838 646.4, dated Jun. 28, 2019.

Office action for European Patent Application No. 16 838 646.4, dated Nov. 10, 2020.

Office action for China Patent Application No. 201680048740.X, dated Jun. 28, 2020.

* cited by examiner

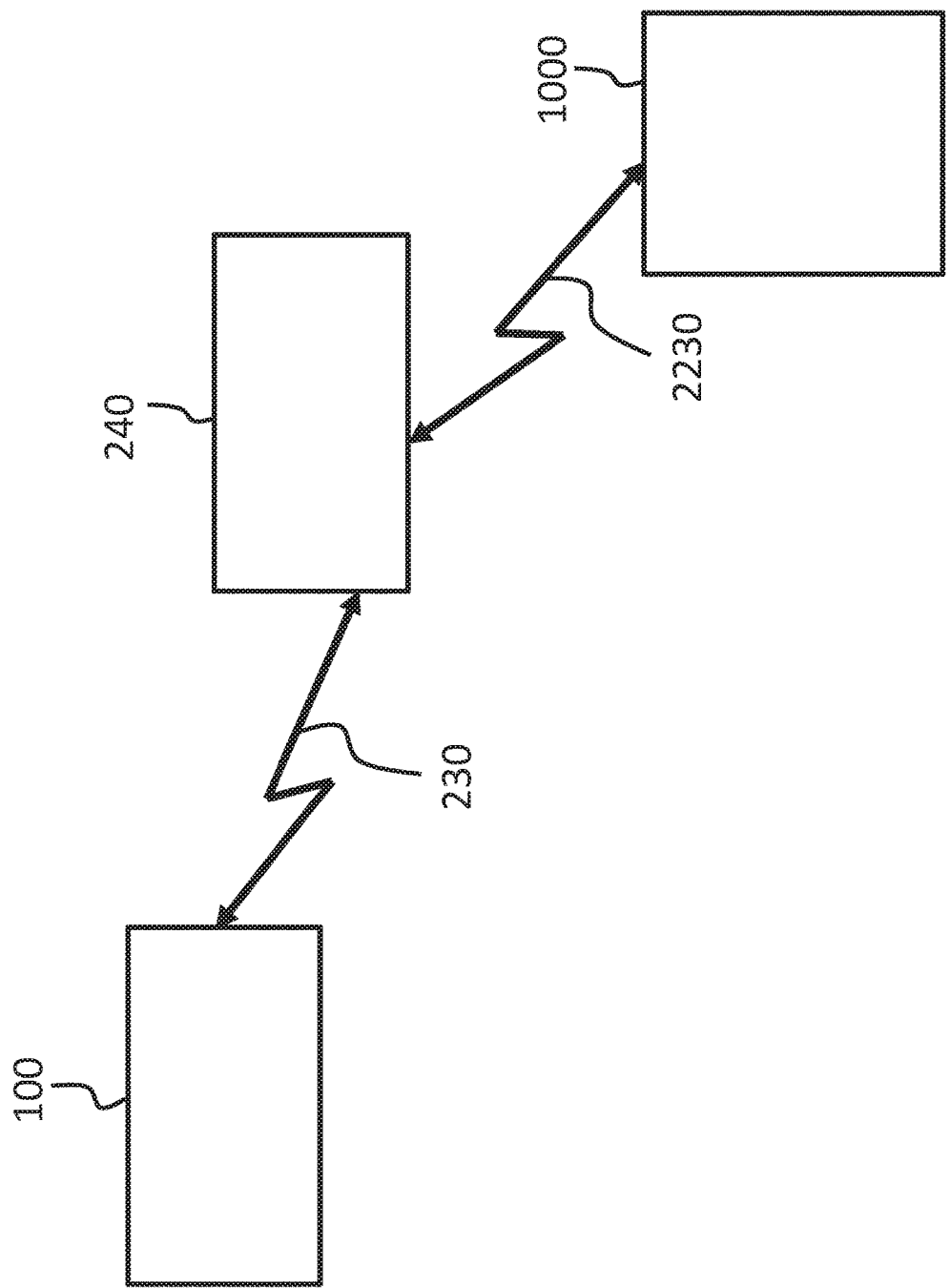

PROSTHESIS FUNCTIONALITY CONTROL AND DATA PRESENTATION

CROSS-REFERENCE TO RELATED APPLICATIONS

This application is a Divisional application of U.S. patent application Ser. No. 15/163,132, filed May 24, 2016, which claims priority to Provisional U.S. Patent Application No. 62/208,944, entitled PROSTHESIS FUNCTIONALITY CONTROL AND DATA PRESENTATION, filed on Aug. 24, 2015, naming Ivana Popovac of Macquarie University, Australia as an inventor, the entire contents of that application being incorporated herein by reference in its entirety.

BACKGROUND

Hearing loss, which may be due to many different causes, is generally of two types: conductive and sensorineural. Sensorineural hearing loss is due to the absence or destruction of the hair cells in the cochlea that transduce sound signals into nerve impulses. Various hearing prostheses are commercially available to provide individuals suffering from sensorineural hearing loss with the ability to perceive sound. One example of a hearing prosthesis is a cochlear implant.

Conductive hearing loss occurs when the normal mechanical pathways that provide sound to hair cells in the cochlea are impeded, for example, by damage to the ossicular chain or the ear canal. Individuals suffering from conductive hearing loss may retain some form of residual hearing because the hair cells in the cochlea may remain undamaged.

Individuals suffering from hearing loss typically receive an acoustic hearing aid. Conventional hearing aids rely on principles of air conduction to transmit acoustic signals to the cochlea. In particular, a hearing aid typically uses an arrangement positioned in the recipient's ear canal or on the outer ear to amplify a sound received by the outer ear of the recipient. This amplified sound reaches the cochlea causing motion of the perilymph and stimulation of the auditory nerve. Cases of conductive hearing loss typically are treated by means of bone conduction hearing aids. In contrast to conventional hearing aids, these devices use a mechanical actuator that is coupled to the skull bone to apply the amplified sound.

In contrast to hearing aids, which rely primarily on the principles of air conduction, certain types of hearing prostheses, commonly referred to as cochlear implants, convert a received sound into electrical stimulation. The electrical stimulation is applied to the cochlea, which results in the perception of the received sound.

Many devices, such as medical devices that interface with a recipient, have structural and/or functional features where there is utilitarian value in adjusting such features for an individual recipient. The process by which a device that interfaces with or otherwise is used by the recipient is tailored or customized or otherwise adjusted for the specific needs or specific wants or specific characteristics of the recipient is commonly referred to as fitting. One type of medical device where there is utilitarian value in fitting such to an individual recipient is the above-noted cochlear implant. That said, other types of medical devices, such as other types of hearing prostheses, exist where there is utilitarian value in fitting such to the recipient.

SUMMARY

In accordance with an exemplary embodiment, there is a portable handheld device, comprising a mobile computer having a display, wherein the portable handheld device is configured to receive data from a hearing prosthesis and present an interface display on the display from among a plurality of different interface displays based on the received data. Thus, in accordance with another exemplary embodiment, there is a portable body carried device, comprising a mobile computer having a display, wherein the portable body carried device is configured to receive data from a hearing prosthesis and present an interface display on the display from among a plurality of different interface displays based on the received data.

In accordance with another exemplary embodiment, there is a system, comprising a hearing prosthesis including a stimulation device configured to be attached to a recipient and configured to evoke a hearing percept based on input, and a remote device including a display, the remote device being configured to communicate with the hearing prosthesis, wherein the system is configured to analyze data relating to the hearing prosthesis, and the system is configured to present an interface display on the display from among a plurality of different interface displays based on the analysis.

In accordance with another exemplary embodiment, there is a method of using a prosthesis, comprising automatically obtaining data pertaining to usage of the prosthesis, automatically changing a touchscreen display on a smartphone touchscreen including the touchscreen, based on the obtained data, and enabling the adjustment of a setting on the prosthesis by inputting data into the changed touchscreen display. Thus, In accordance with another exemplary embodiment, there is a method of using a prosthesis, comprising automatically obtaining data pertaining to usage of the prosthesis, automatically changing a display on a based on the obtained data; and enabling the adjustment of a setting on the prosthesis by inputting data into the phone.

In accordance with another exemplary embodiment, there is a portable handheld device, comprising a cellular telephone communication suite, and a hearing prosthesis functionality suite, including a touchscreen display, wherein the hearing prosthesis functionality suite is configured to enable a recipient to adjust a feature of a hearing prosthesis remote from the portable handheld device via the touchscreen display, and the portable handheld device is configured to automatically analyze user use of the portable handheld device and present different hearing prosthesis functions on the display based on the automatic analysis.

BRIEF DESCRIPTION OF THE DRAWINGS

Embodiments are described below with reference to the attached drawings, in which:

FIG. 11 presents another exemplary functional schematic of an exemplary system according to an exemplary embodiment.

DETAILED DESCRIPTION

Figure 1:
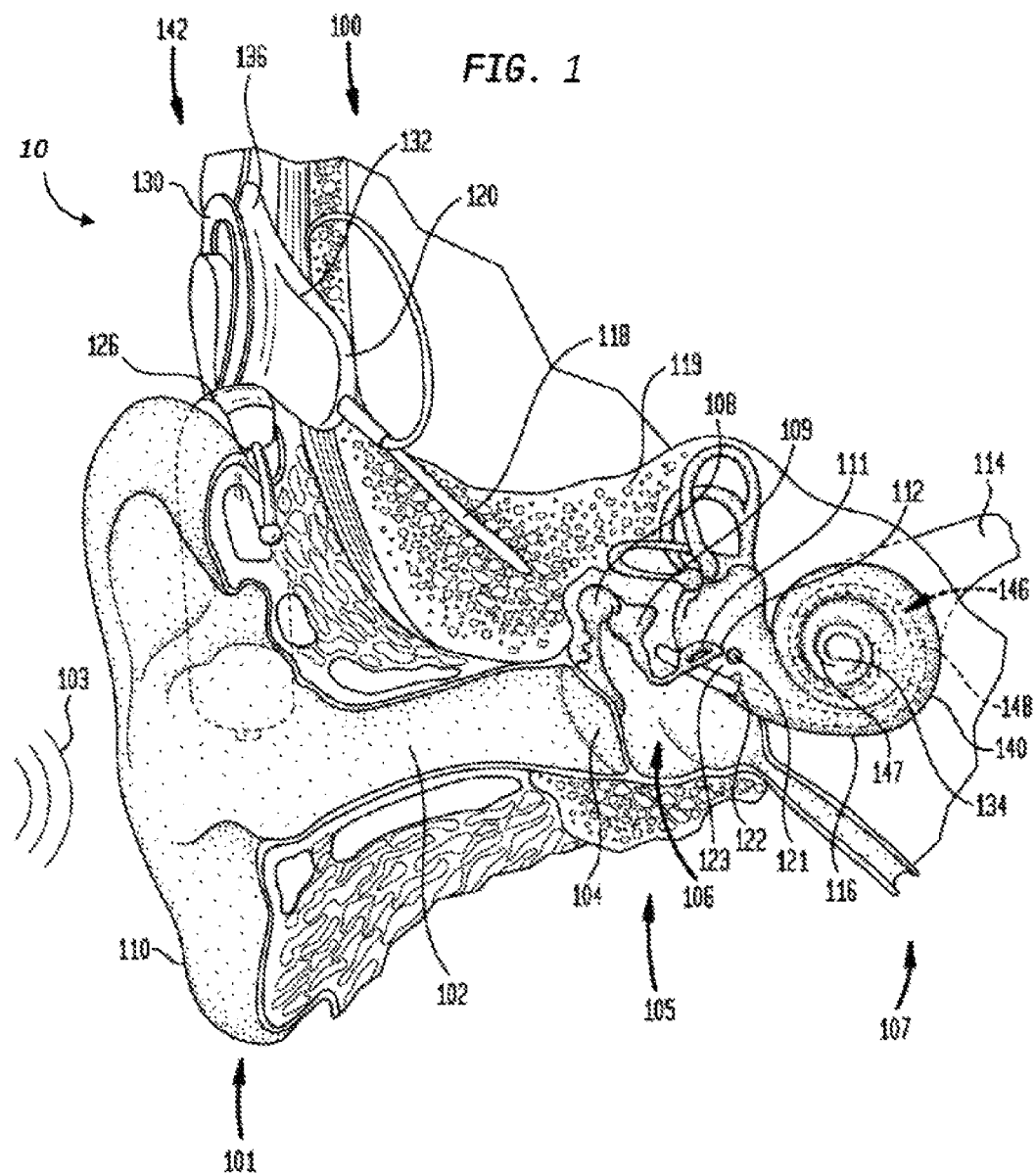
FIG. 1 is a perspective view of an exemplary hearing prosthesis in which at least some of the teachings detailed herein are applicable.

FIG. 1 is a perspective view of a cochlear implant, referred to as cochlear implant 100, implanted in a recipient, to which some embodiments detailed herein and/or variations thereof are applicable. The cochlear implant 100 is part of a system 10 that can include external components in some embodiments, as will be detailed below. It is noted that the teachings detailed herein are applicable, in at least some embodiments, to partially implantable and/or totally implantable cochlear implants (i.e., with regard to the latter, such as those having an implanted microphone and/or implanted battery). It is further noted that the teachings detailed herein are also applicable to other stimulating devices that utilize an electrical current beyond cochlear implants (e.g., auditory brain stimulators, pacemakers, etc.). Additionally, it is noted that the teachings detailed herein are also applicable to other types of hearing prostheses, such as by way of example only and not by way of limitation, bone conduction devices, direct acoustic cochlear stimulators, middle ear implants, etc. Indeed, it is noted that the teachings detailed herein are also applicable to so-called hybrid devices. In an exemplary embodiment, these hybrid devices apply both electrical stimulation and acoustic stimulation to the recipient. Any type of hearing prosthesis to which the teachings detailed herein and/or variations thereof that can have utility can be used in some embodiments of the teachings detailed herein.

In view of the above, it is to be understood that at least some embodiments detailed herein and/or variations thereof are directed towards a body-worn sensory supplement medical device (e.g., the hearing prosthesis of FIG. 1, which supplements the hearing sense, even in instances where all natural hearing capabilities have been lost). It is noted that at least some exemplary embodiments of some sensory supplement medical devices are directed towards devices such as conventional hearing aids, which supplement the hearing sense in instances where some natural hearing capabilities have been retained, and visual prostheses (both those that are applicable to recipients having some natural vision capabilities remaining and to recipients having no natural vision capabilities remaining). Accordingly, the teachings detailed herein are applicable to any type of sensory supplement medical device to which the teachings detailed herein are enabled for use therein in a utilitarian manner. In this regard, the phrase sensory supplement medical device refers to any device that functions to provide sensation to a recipient irrespective of whether the applicable natural sense is only partially impaired or completely impaired.

The recipient has an outer ear 101, a middle ear 105 and an inner ear 107. Components of outer ear 101, middle ear 105 and inner ear 107 are described below, followed by a description of cochlear implant 100.

In a fully functional ear, outer ear 101 comprises an auricle 110 and an ear canal 102. An acoustic pressure or sound wave 103 is collected by auricle 110 and channeled into and through ear canal 102. Disposed across the distal end of ear channel 102 is a tympanic membrane 104 which vibrates in response to sound wave 103. This vibration is coupled to oval window or fenestra ovalis 112 through three bones of middle ear 105, collectively referred to as the ossicles 106 and comprising the malleus 108, the incus 109 and the stapes 111. Bones 108, 109 and 111 of middle ear 105 serve to filter and amplify sound wave 103, causing oval window 112 to articulate, or vibrate in response to vibration of tympanic membrane 104. This vibration sets up waves of fluid motion of the perilymph within cochlea 140. Such fluid motion, in turn, activates tiny hair cells (not shown) inside of cochlea 140. Activation of the hair cells causes appropriate nerve impulses to be generated and transferred through the spiral ganglion cells (not shown) and auditory nerve 114 to the brain (also not shown) where they are perceived as sound.

As shown, cochlear implant 100 comprises one or more components which are temporarily or permanently implanted in the recipient. Cochlear implant 100 is shown in FIG. 1 with an external device 142, that is part of system 10 (along with cochlear implant 100), which, as described below, is configured to provide power to the cochlear implant, where the implanted cochlear implant includes a battery that is recharged by the power provided from the external device 142.

In the illustrative arrangement of FIG. 1, external device 142 can comprise a power source (not shown) disposed in a Behind-The-Ear (BTE) unit 126. External device 142 also includes components of a transcutaneous energy transfer link, referred to as an external energy transfer assembly. The transcutaneous energy transfer link is used to transfer power and/or data to cochlear implant 100. Various types of energy transfer, such as infrared (IR), electromagnetic, capacitive and inductive transfer, may be used to transfer the power and/or data from external device 142 to cochlear implant 100. In the illustrative embodiments of FIG. 1, the external energy transfer assembly comprises an external coil 130 that forms part of an inductive radio frequency (RF) communication link. External coil 130 is typically a wire antenna coil comprised of multiple turns of electrically insulated single-strand or multi-strand platinum or gold wire. External device 142 also includes a magnet (not shown) positioned within the turns of wire of external coil 130. It should be appreciated that the external device shown in FIG. 1 is merely illustrative, and other external devices may be used with embodiments of the present invention.

Cochlear implant 100 comprises an internal energy transfer assembly 132 which can be positioned in a recess of the temporal bone adjacent auricle 110 of the recipient. As detailed below, internal energy transfer assembly 132 is a component of the transcutaneous energy transfer link and receives power and/or data from external device 142. In the illustrative embodiment, the energy transfer link comprises an inductive RF link, and internal energy transfer assembly 132 comprises a primary internal coil 136. Internal coil 136 is typically a wire antenna coil comprised of multiple turns of electrically insulated single-strand or multi-strand platinum or gold wire.

Cochlear implant 100 further comprises a main implantable component 120 and an elongate electrode assembly 118. In some embodiments, internal energy transfer assembly 132 and main implantable component 120 are hermetically sealed within a biocompatible housing. In some embodiments, main implantable component 120 includes an implantable microphone assembly (not shown) and a sound processing unit (not shown) to convert the sound signals received by the implantable microphone in internal energy transfer assembly 132 to data signals. That said, in some alternative embodiments, the implantable microphone assembly can be located in a separate implantable component (e.g., that has its own housing assembly, etc.) that is in signal communication with the main implantable component 120 (e.g., via leads or the like between the separate implantable component and the main implantable component 120). In at least some embodiments, the teachings detailed herein and/or variations thereof can be utilized with any type of implantable microphone arrangement.

Main implantable component 120 further includes a stimulator unit (also not shown) which generates electrical stimulation signals based on the data signals. The electrical stimulation signals are delivered to the recipient via elongate electrode assembly 118.

Elongate electrode assembly 118 has a proximal end connected to main implantable component 120, and a distal end implanted in cochlea 140. Electrode assembly 118 extends from main implantable component 120 to cochlea 140 through mastoid bone 119. In some embodiments, electrode assembly 118 may be implanted at least in basal region 116, and sometimes further. For example, electrode assembly 118 may extend towards apical end of cochlea 140, referred to as cochlea apex 134. In certain circumstances, electrode assembly 118 may be inserted into cochlea 140 via a cochleostomy 122. In other circumstances, a cochleostomy may be formed through round window 121, oval window 112, the promontory 123 or through an apical turn 147 of cochlea 140.

Electrode assembly 118 comprises a longitudinally aligned and distally extending array 146 of electrodes 148, disposed along a length thereof. As noted, a stimulator unit generates stimulation signals which are applied by electrodes 148 to cochlea 140, thereby stimulating auditory nerve 114.

Figure 2A:
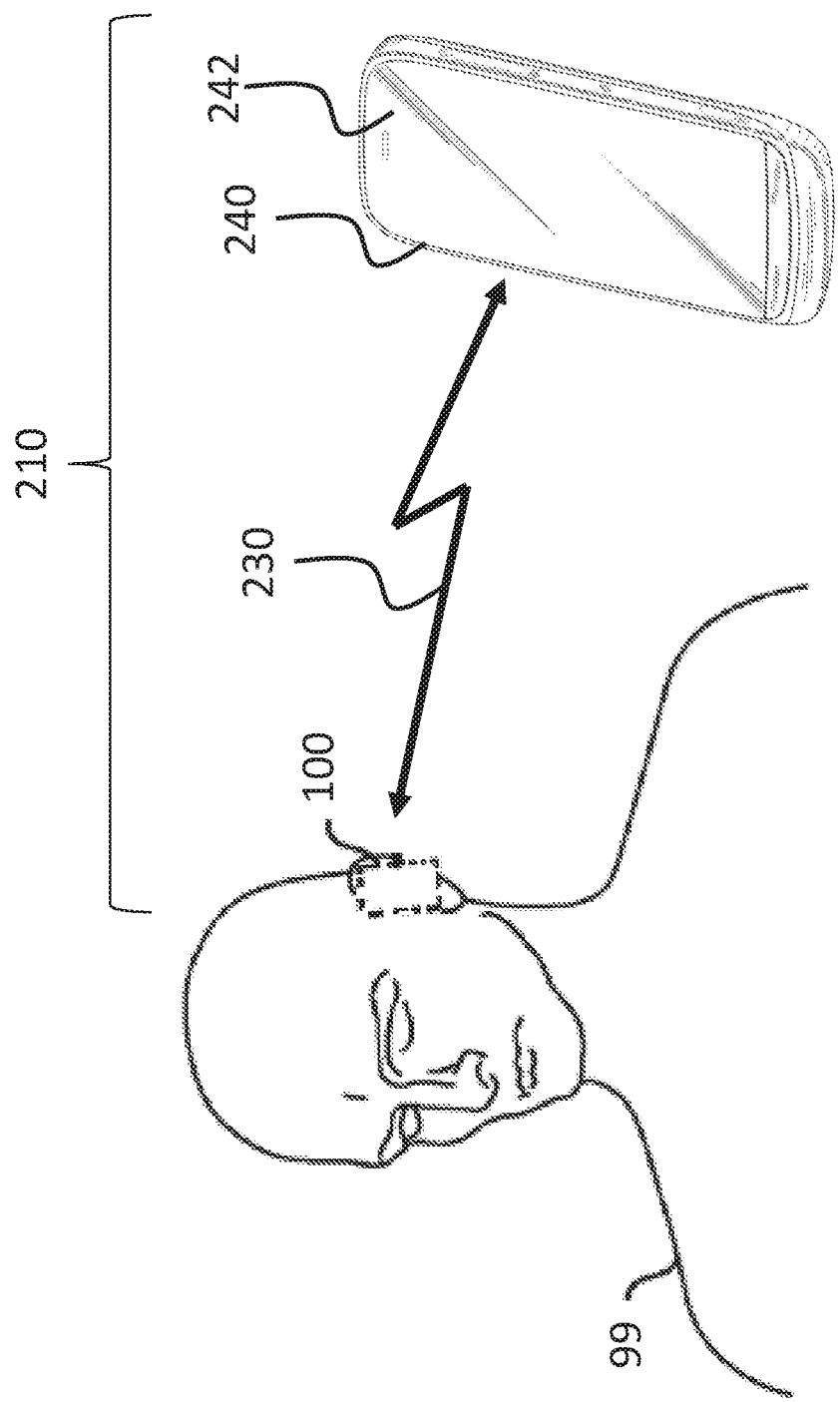
FIG. 2A presents an exemplary system including a hearing prosthesis and a remote device in the form of a portable handheld device.

FIG. 2A depicts an exemplary system 210 according to an exemplary embodiment, including hearing prosthesis 100, which, in an exemplary embodiment, corresponds to cochlear implant 100 detailed above, and a portable body carried device (e.g. a portable handheld device as seen in FIG. 2A, a watch, a pocket device, etc.) 240 in the form of a mobile computer having a display 242. The system includes a wireless link 230 between the portable handheld device 240 and the hearing prosthesis 100. In an exemplary embodiment, the hearing prosthesis 100 is an implant implanted in recipient 99 (as represented functionally by the dashed lines of box 100 in FIG. 2A). It is noted that while the embodiments detailed herein will be described in terms of utilization of a cochlear implant, alternative embodiments can be utilized in other types of hearing prostheses, such as by way of example only and not by way of limitation, bone conduction devices (percutaneous, active transcutaneous and/or passive transcutaneous), Direct Acoustic Cochlear Implants (DACI). That said, in an alternate embodiment, the hearing prosthesis 100 can be a non-implantable component, such as a conventional hearing aid (e.g., using an in-the-ear speaker/receiver). Still further, in an exemplary embodiment, the hearing prosthesis 100 can be a multimodal device (two or more types of stimulation and/or two or more components (one implanted and one external component)), such as a hybrid device (available from Cochlear LTD of Australia). Hereinafter, the hearing prosthesis 100 will be described in terms of a cochlear implant for simplicity. Also, it is noted that the teachings detailed herein can also be applicable to non-hearing related prostheses, such as retinal implants, prosthetic limbs, etc. However, unless otherwise specified or otherwise impractical due to technology limitations, any disclosure herein relating to the cochlear implant also corresponds to a disclosure relating to another type of prosthesis (another type of hearing prosthesis or otherwise). That is, any disclosure herein with regard to one of these types of hearing prostheses corresponds to a disclosure of another of these types of hearing prostheses or any other prosthetic medical device, unless otherwise specified, or unless the disclosure thereof is incompatible with a given hearing prosthesis based on the current state of technology. It is noted that embodiments detailed herein will be described in terms of a portable body carried device in the form of a portable handheld device such as a smartphone. Any disclosure herein regarding a portable handheld device also corresponds to a disclosure of any other type of portable body carried device, such as by way of example only and not by way of limitation, a smartwatch, a pocket carried device, etc.

In an exemplary embodiment, the system 210 is configured such that the hearing prosthesis 100 and the portable handheld device 240 have a symbiotic relationship. In an exemplary embodiment, the symbiotic relationship is the ability to display data relating to, and, in at least some instances, the ability to control, one or more functionalities of the hearing prosthesis 100. In an exemplary embodiment, this can be achieved via the ability of the handheld device 240 to receive data from the hearing prosthesis 100 via the wireless link 230 (although in other exemplary embodiments, other types of links, such as by way of example, a wired link, can be utilized). As will also be detailed below, this can be achieved via communication with a geographically remote device in communication with the hearing prosthesis 100 and/or the portable handheld device 240 via link, such as by way of example only and not by way of limitation, an Internet connection or a cell phone connection. In some such exemplary embodiments, the system 210 can further include the geographically remote apparatus as well. Again, additional examples of this will be described in greater detail below.

As noted above, in an exemplary embodiment, the portable handheld device 240 comprises a mobile computer and a display 242. In an exemplary embodiment, the display 242 is a touchscreen display. In an exemplary embodiment, the portable handheld device 240 also has the functionality of a portable cellular telephone. In this regard, device 240 can be, by way of example only and not by way of limitation, a smart phone as that phrase is utilized generically. That is, in an exemplary embodiment, portable handheld device 240 comprises a smart phone, again as that term is utilized generically.

The phrase "mobile computer" entails a device configured to enable human-computer interaction, where the computer is expected to be transported away from a stationary location during normal use. Again, in an exemplary embodiment, the portable handheld device 240 is a smart phone as that term is generically utilized. However, in other embodiments, less sophisticated (or more sophisticated) mobile computing devices can be utilized to implement the teachings detailed herein and/or variations thereof. Any device, system, and/or method that can enable the teachings detailed herein and/or variations thereof to be practiced can be utilized in at least some embodiments. (As will be detailed below, in some instances, device 240 is not a mobile computer, but instead a remote device (remote from the hearing prosthesis 100. Some of these embodiments will be described below).)

In an exemplary embodiment, the portable handheld device 240 is configured to receive data from a hearing prosthesis and present an interface display on the display from among a plurality of different interface displays based on the received data. Exemplary embodiments will sometimes be described in terms of data received from the hearing prosthesis 100. However, it is noted that any disclosure that is also applicable to data sent to the hearing prostheses from the handheld device 240 is also encompassed by such disclosure, unless otherwise specified or otherwise incompatible with the pertinent technology (and visa-versa).

There is utilitarian value with respect to presenting a given display versus another given display. By way of example only and not by way limitation, different displays can be utilized to present or otherwise prioritize certain applications and/or prioritize certain functions of certain applications (including apps). In this regard, in at least some exemplary embodiments, a given display will have one or more applications associated therewith. Indeed, exemplary displays can include two or more app icons, which icons can be selected to enter into a given app. Some exemplary displays can correspond to the app itself. Note further, that some exemplary displays can include both the app itself, plus icons to other apps. It is further noted that the term "app" as used herein also includes sub-apps.

It is noted that any disclosure herein related to the presentation of a given interface display also corresponds to a disclosure of the presentation of a display that includes an icon that when opened results in a given interface display. That is, while some embodiments are directed towards automatically presenting a given display based on data, other embodiments are directed towards automatically presenting icons for that display (which in and of itself constitutes the presentation of an interface display).

In an exemplary embodiment, displays can have the functionality for general control of the hearing prosthesis 100 and/or have the functionality to present information associated with the hearing prosthesis 100 (these functionalities are not mutually exclusive).

It is further noted that in at least some exemplary embodiments, the data received by the portable handheld device 240 entails any contextual data that can be provided by any component of a prosthesis system (the implantable component and the external components (both the prosthesis component and the support component(s), such as a remote assistant) to a portable handheld device or to a remote device. Also, it is noted that in at least some exemplary embodiments, any display that can have utilitarian value (such as serving as the interface for an app) can be presented based on the received data.

Figure 3:
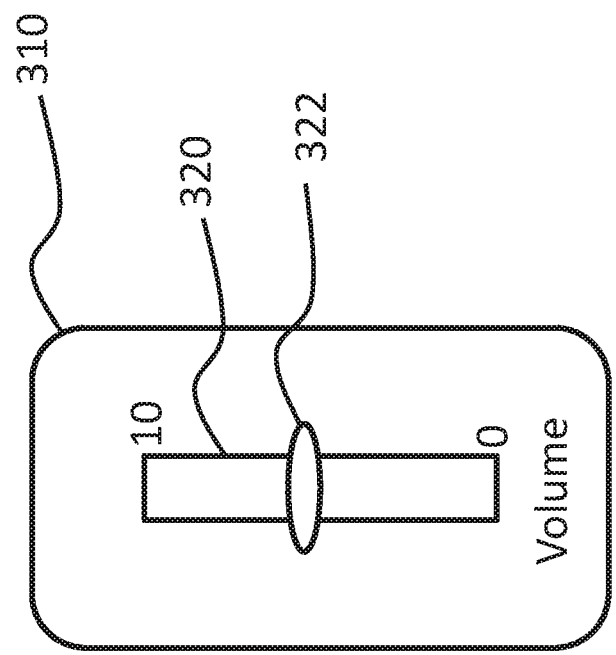
FIG. 3 presents an exemplary interface display that can be displayed on a display screen of the portable handheld device.
Figure 4:
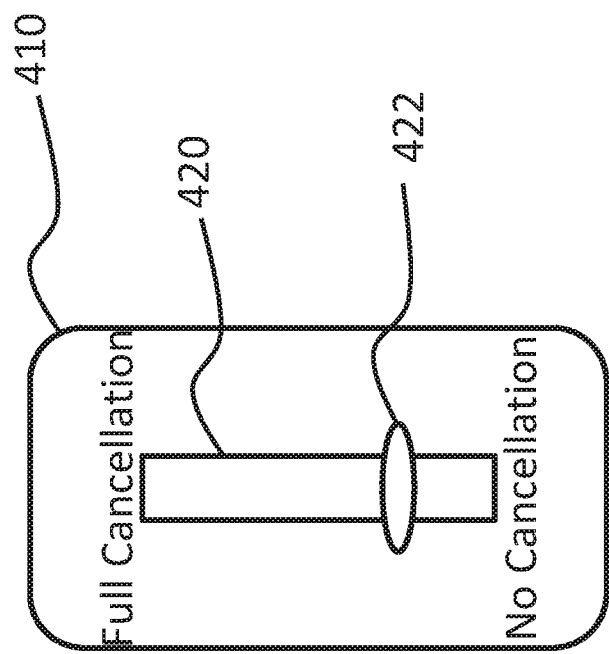
FIG. 4 presents another exemplary interface display that can be displayed on a display screen of the portable handheld device.

In an exemplary embodiment, the plurality of displays can include a volume control display, an adaptive feature control display (e.g., a noise cancellation control display), a mixer display, etc. FIG. 3 presents an exemplary volume control display, and FIG. 4 presents an exemplary noise cancellation control display, which displays can be displayed on display 242. In FIG. 3, the volume display 310 includes a scrollbar 320 with an indicator 322. The volume display 310 is a scale that runs from 0 to 10, with 0 being no sound/no volume, and 10 being the loudest sound, the loudest volume. While only two numerals are depicted in the volume display, additional numerals and/or gradients can be depicted. The volume display 310 depicts the volume setting of the hearing prosthesis 100. As noted above, the interface display (in this case, the volume display 310) is presented on display 242 based on the received data that is received from the hearing prosthesis 100 by the handheld device 240, or the sent data that is sent to the hearing prosthesis 100 by the handheld device 240. Particularly, in this exemplary embodiment, by way of example, the location of the indicator 322 is located based on such (the location of the indicator 322 between 0 and 10).

It is noted that while in some embodiments, the displays as detailed herein are passive displays (i.e., they display only the status of the given functionality of the hearing prosthesis, in this example, the volume setting). In an alternate embodiment, the displays can be active displays (i.e., the display can be a touchscreen or the like, in this example, the indicator 322 being an indicator that is moved by the recipient via a swiping action or the like across the touchscreen). It is noted that an active display does not preclude passive display functionality. In this regard, while the display 310 can be utilized to adjust the volume of the hearing prosthesis by moving the location of the indicator 322 along the scrollbar 320, in at least some exemplary embodiments, the action of adjusting the volume control on the hearing prosthesis 100 or utilizing an input elsewhere on device 240 (such as the push button volume control) will also move the indicator 322 accordingly.

Note further that some exemplary embodiments where the portable handheld device 240 is utilized to control the hearing prosthesis 100 do not necessarily utilize a touchscreen. By way of example, the portable handheld device 240 can include a mechanical volume adjuster (knob, slide bar, push button volume control, etc.) that the recipient utilizes to input a change of volume control command, which change of volume control command is communicated via the wireless link 230 to the hearing prosthesis. The display 310 is presented or otherwise adjusted to place the indicator 322 at the location corresponding to the control command sent by the portable handheld device 240. That said, in an alternate embodiment, the display 310 is presented or otherwise adjusted to place the indicator 322 at the location based on data received from the hearing prosthesis 100 (e.g., the hearing prosthesis 100 provides data to the handheld device 240 indicating the current volume, which current volume has been changed owing to the control command sent to the hearing prosthesis 100).

FIG. 4 presents an exemplary adaptive feature control display in the form of a noise cancellation control display 410. As can be seen, the display 410 includes a scrollbar 420, along with an indicator 422. The display further displays the words "No Cancellation" at the bottom of the scrollbar 420, and the words "Full Cancellation" at the top of the scrollbar 420. The location of the indicator 420 corresponds to the level of noise cancellation to which the hearing prosthesis 100 is set. In an exemplary embodiment, the operational features of the adaptive feature control display 410 correspond to those detailed above with respect to display 310

(e.g., the display 410 can be a touchscreen display, or can just be a passive display etc.).

In an exemplary embodiment, as noted above, the portable handheld device is configured to present an interface display on the display 442 from among a plurality of different interface displays based on at least one of received data received from the hearing prosthesis 100, or sent data sent to the hearing prosthesis 100. In an exemplary embodiment, the plurality of different interface displays can include display 310 and display 410, although other embodiments can include other displays and need not necessarily include both for even one of these displays. In an exemplary embodiment, the portable handheld device is configured to analyze received data from the hearing prosthesis 100 and present the interface display on the display 242 based on the analysis of the received data. Accordingly, in an exemplary scenario, a recipient of the hearing prosthesis 100 manually adjusts the volume of the hearing prosthesis by utilizing the adjustments on the hearing prosthesis 100. The hearing prosthesis accordingly adjusts the volume, but also transmits a signal via the link 230 to the handheld device 240 indicating that the volume of the hearing prosthesis 100 has been adjusted. Based on this received data, the handheld device 240 chooses the volume control display 310 from the plurality of possible displays (e.g., instead of display 410, or instead of another display, such as the display that permits cellular telephone dialing, or a display that displays the high-level handheld device icons (e-mail, camera, calendar, pictures, etc.)) and displays that on the display 242. In this regard, in an exemplary embodiment, this is done automatically by the portable handheld device 240 as a result of the mobile computing functionality thereof, the portable handheld device 240 being at least in part, a mobile computer.

By way of example only and not by way of limitation, the action of displaying the display results in a previously displayed display being superseded by this new display. Note that this also includes the concept of modifying a current display (e.g., a split-screen can be displayed, where, for example, the subject matter displayed on the previous display is reduced to one side of the display, and the subject matter of the new display is presented on the other side of the display—this is considered a different display/display change according to the teachings herein). Accordingly, in an exemplary embodiment, the plurality of displays need not necessarily be pre-existing displays. The displays can be created or otherwise generated as this scenario arises.

With respect to the aforementioned analysis of the pertinent data, in an exemplary embodiment, the portable handheld device 240 is programmed or otherwise configured to evaluate the data (e.g., extract the information out of the data, recognize the carrier form of the data and determine what type of command is indicated by the data, etc.) and choose the particular interface display can be presented on the display 240. Indeed, in an exemplary embodiment, the data received from the prosthesis 100 can be command data instructing the portable handheld device 240 to change the display. In this regard, in an exemplary embodiment, the hearing prosthesis 100 is configured to control what is displayed on display 242 of the portable handheld device 240.

In at least some exemplary embodiments, the above functionality can have utilitarian value in that it can prioritize a given display without the recipient having to manually prompt (which includes verbal instructions) the portable handheld device 240 to display a given interface display. In at least some exemplary embodiments, the aforementioned utility can entail, for example, allowing the recipient to visually see the current volume setting as it changes as he or she adjusts the volume of the hearing prosthesis 100 by adjusting the manual controls thereof (which also includes verbal instructions to the hearing prosthesis 100), which manual controls might not necessarily be visible to the recipient (e.g. in the case of a behind the ear device), or, even invisible, might not necessarily provide an indication of the current volume (e.g., in the case of a simple binary control device). In this regard, the portable handheld device 240 will automatically display the current volume setting without the recipient having to prompt that display.

It is noted that the above exemplary scenario is also applicable to a scenario where the recipient adjusts a noise cancellation setting on the prosthesis 100, or any other adjustment on the hearing prosthesis 100 to which the teachings detailed herein and/or variations thereof are applicable.

It is noted that the aforementioned action of displaying an interface display from amongst a plurality of interface displays can be executed by reorganizing a given display and/or by prioritizing elements on a given display relative to that which was the case prior to the action of displaying an interface display from amongst a plurality of interface displays.

It is noted that in at least some exemplary embodiments, the interface display that is displayed according to the analyzed data can be maintained on the display 242 for a fixed period of time, after which the display 242 changes to another display (e.g., defaulting back to the previous display, changing to another interface display that the recipient, on a statistically significant basis, selects after changing the volume—more on this below). Alternatively, in an exemplary embodiment, the interface display that is displayed according to the analyzed data remains in place until the recipient selects another interface display.

The above exemplary embodiments have been described in terms of the recipient acting to provide input to the hearing prosthesis 100 to make an adjustment to one or more of the functional features thereof. In an alternative embodiment, the system 210 is configured such that the automatic display of a given display of the plurality of displays occurs as a result of data that is not prompted by the recipient, at least not directly. In an exemplary embodiment, the received data received from the hearing prosthesis 100 is based on one or more features of an audio input, such as by way of example only and not by way of limitation, an audio stream, received by the hearing prosthesis, the audio stream being utilized to evoke a hearing percept. (It is noted that as will be detailed below, in an alternate embodiment, the system 210 is configured to execute the teachings detailed herein relating to the audio input in the absence of data received from the hearing prosthesis 100. In this regard, unless otherwise specified, any disclosure herein of data received from the hearing prosthesis number 100 also corresponds to a disclosure of data received from another source, unless otherwise specified, at least providing that such is compatible with current technology.

Figure 5:
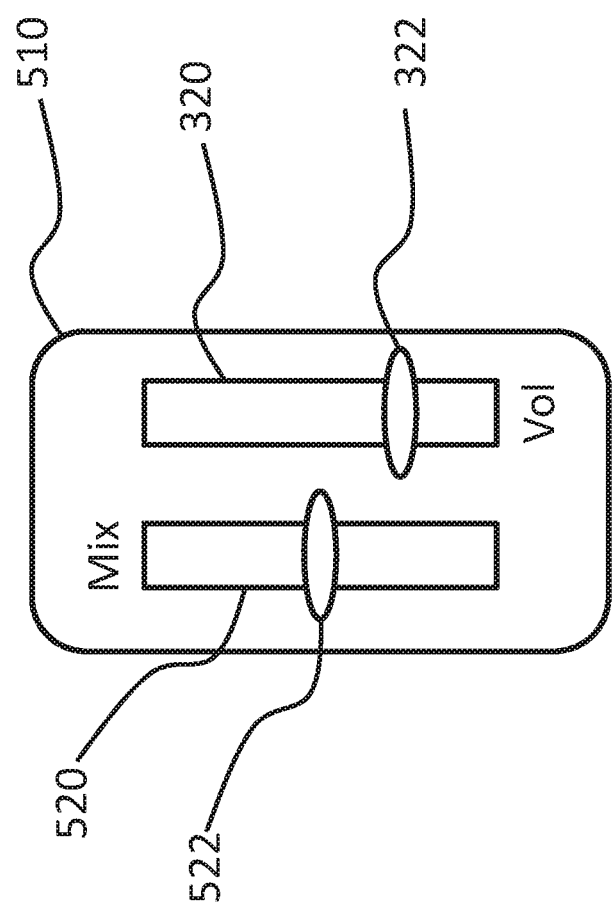
FIG. 5 presents another exemplary interface display that can be displayed on a display screen of the portable handheld device.

Along these lines, in an exemplary embodiment, the portable handheld device 240 is configured to evaluate the type of audio that is being inputted to the hearing prosthesis 100. Based on this evaluation, the portable handheld device 240 is configured to present information to the recipient that is contextual to the audio input. By way of example only and not by way of limitation, during a given audio input, handheld device 240 is configured to automatically present a screen showing volumes and/or mixing ratios for that audio input, based on the analysis of the data from the hearing prosthesis 100 (or from another source in another embodiment, as will be detailed below). In this regard, FIG. 5 depicts an exemplary display 510, having a volume scrollbar 320 and indicator 322 on the right side, and a mixing ratio scrollbar 520 having an indicator 522 on the left (in an exemplary embodiment, the display 510 is a touch-screen display enabling the recipient to adjust the mix ratio and the volume by moving the respective indicators, whereas in an alternate embodiment, the display 510 it is a passive display).

Note further that in an exemplary embodiment, the fact that the hearing prosthesis 100 is receiving an audio input can be the data upon which a determination is made to display one of the displays from amongst a plurality of displays. In this regard, if the received data is data indicative of the hearing prosthesis receiving an audio input (e.g., an input from another source other than the microphone thereof), a mixing ratio display can be automatically displayed, or at least the icon for that application can be presented on the display such that the recipient need not change the display to access that icon (e.g., the icon is prioritized). That said, in an alternate embodiment, as noted above, the hearing prosthesis 100 can instruct the remote device 242 present that display.

Accordingly, in an exemplary embodiment, the system 210 is configured to automatically recognize a given input to the hearing prosthesis 100 or recognize how the hearing prosthesis 100 is being utilized, and, based upon that recognition, present a given interface display.

In an alternate embodiment, different displays can be temporally presented: the volume display 310 can be displayed first, followed by a display for a mixing ratio displayed after a certain period of time and/or after the input relating to the volume is deemed completed. In this regard, in at least some exemplary embodiments, it can be seen that the control of the displays can be based on a combination of the data received from the hearing prosthesis 100 and other source data (e.g., the aforementioned input of the volume, a timeout period in which no volume adjustment is made, etc.).

Note further that the displays can be "smart displays" as well. By way of example only and not by way limitation, the displays presented based on the data received from the hearing prosthesis number 100 can include a recommended setting, or at least a proposed setting that corresponds to a setting selected by a statistically significant population for a given audio input.

Still further, the analysis of the data is not limited to those source and/or type of audio input. An exemplary embodiment, the portable handheld device 240 is configured to recognize specific audio content. By way of example, the portable handheld device 240 can be configured to recognize certain songs that the recipient appears to be dissatisfied with (e.g., because in the past, the recipient has halted the input of the audio upon hearing that given song), and automatically present a channel selector or the like display, such that the recipient can change the channel.

Accordingly, in an exemplary embodiment, the portable handheld device 240 is configured to receive data (either from the hearing prosthesis or another source, such as the source of the audio input, which audio input is received by the portable handheld device 240) that is based on one or more features of an audio input from a media system received by the hearing prosthesis, the audio stream received by the prosthesis being utilized to evoke a hearing. In an exemplary embodiment, the media system is a television, a stable media player (MP3, CD, tape), a radio system, an internet system, etc. In an exemplary embodiment, the portable handheld device 240 is configured to automatically present a first interface display on the display 242 superseding a prior display displayed on the display based on the received data, the first interface display having a media system control (e.g., the display can be display 310 or 510), wherein the portable handheld device 240 is configured to receive input from the recipient via the display adjusting a control of the media system, and the portable handheld device is configured to output a signal to the media system instructing the media system to adjust a controllable feature based on the input. In an exemplary embodiment, the portable handheld device 240 is configured to receive data from any prosthesis compatible audio accessory, such as a wireless accessory that is configured to communicate directly with the sound processor of the hearing prosthesis.

Accordingly, in an exemplary embodiment, the portable handheld device 240 is configured to receive data (either from the hearing prosthesis or another source, such as the source of the audio input, which audio input is received by the portable handheld device 240) that is based on one or more features of an audio input from a media system received by the hearing prosthesis, the audio stream received by the prosthesis being utilized to evoke a hearing. In an exemplary embodiment, the media system is a television, a stable media player (MP3, CD, tape), a radio system, an internet system, etc. In an exemplary embodiment, the portable handheld device 240 is configured to automatically present a first interface display on the display 242 superseding a prior display displayed on the display based on the received data (e.g., the display can be display 310 or 510).

Figure 6A:
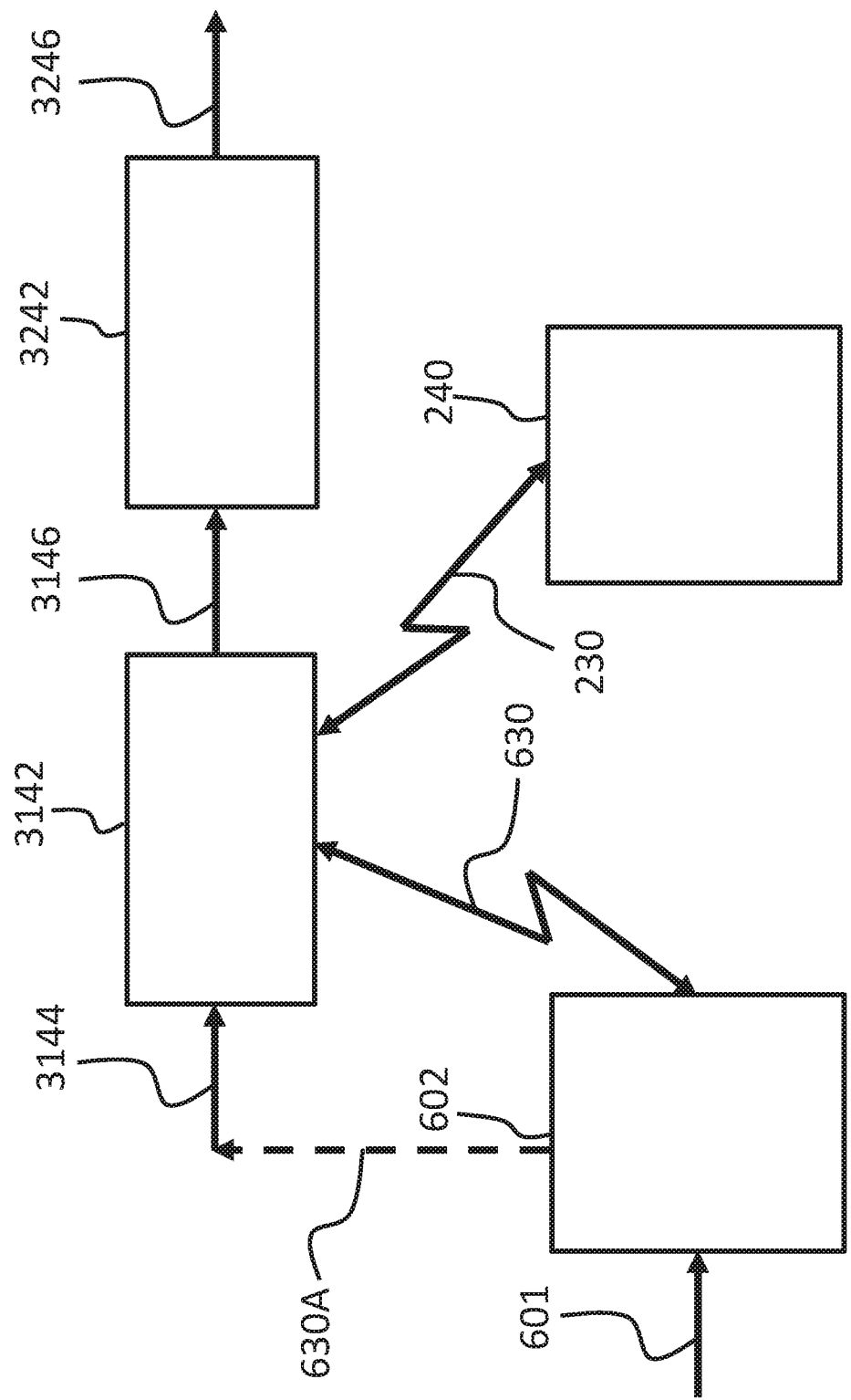
FIG. 6A presents an exemplary functional arrangement detailing communication between black boxes of the hearing prosthesis and a black box of the portable handheld device and a black box of a station.

More specifically, with reference to FIG. 6A, where for the purposes of discussion, an exemplary hearing prosthesis, such as hearing prosthesis 100, can be considered to have a black box unit 3142, having input 3144 corresponding to ambient sound captured by a microphone of unit 3142, and output 3146, and a black box unit 3242, having input 3146 and output 3246, black box unit 3142 corresponding to the external component of the hearing prosthesis (e.g., a BTE (Behind-The-EAR) device, an OTE (Off-The-Ear) device, etc.), and the black box unit 3242 corresponding to the implantable component of the hearing prosthesis (e.g., a receiver stimulator of a cochlear implant). To be clear, black box 3242 of the hearing prosthesis 100 corresponding to a tissue stimulator (e.g., a cochlear electrode array stimulator, or, for example, an actuator of a bone conduction device embodiments where the hearing prosthesis is a bone conduction device, etc.) and the associated components of the hearing prosthesis 100 that transmit data (e.g., a component of an external component that takes output 3146 and then transcutaneous transmits data based on output 3146—thus black box 3242 functionally represents components that are implanted in the recipient as well as components that are located external to the recipient), where output 3246 corresponds to output of the stimulator to stimulate tissue and thus evoke a hearing percept (e.g., electrical current in the case of a cochlear electrode array, vibrations in the case of a bone conduction device, etc.).

Black box 602 corresponds to a media system (e.g., a television), which receives input 601 from a media source (e.g., a cable television line). In an exemplary embodiment, black box 602 outputs a signal 630 to black box 3142, which corresponds to an audio input. In an exemplary embodiment, signal 630 is established by a wireless link, while in an alternative embodiment, signal 630 is established by wired link. It is further noted that in an alternate embodiment, the audio input received by the external component of the hearing prosthesis (black box 3142) is received via ambient air transmission, represented by dashed output 630A from black box 602. That is, the audio input need not necessarily be provided in an electrical signal format. The audio input can be generated by a traditional speaker or the like, which output is transmitted through the air to the speaker of the hearing prosthesis 100.

In the exemplary embodiment depicted in FIG. 6A, the external components of the hearing prosthesis (black box 3142) outputs data via wireless link 230 to portable handheld device 240, also represented by a black box. In an exemplary embodiment, this output data corresponds to the data received by the portable handheld device 240 detailed above, which data is analyzed and upon which the display of the plurality of displays is based. The portable handheld device 240 can be utilized to input control commands according to the teachings detailed above and/or variations thereof, to adjust one or more of the variables of the given functionalities of the hearing prosthesis 3142 (thus represented by the dual arrowheads of link 230).

Figure 6B:
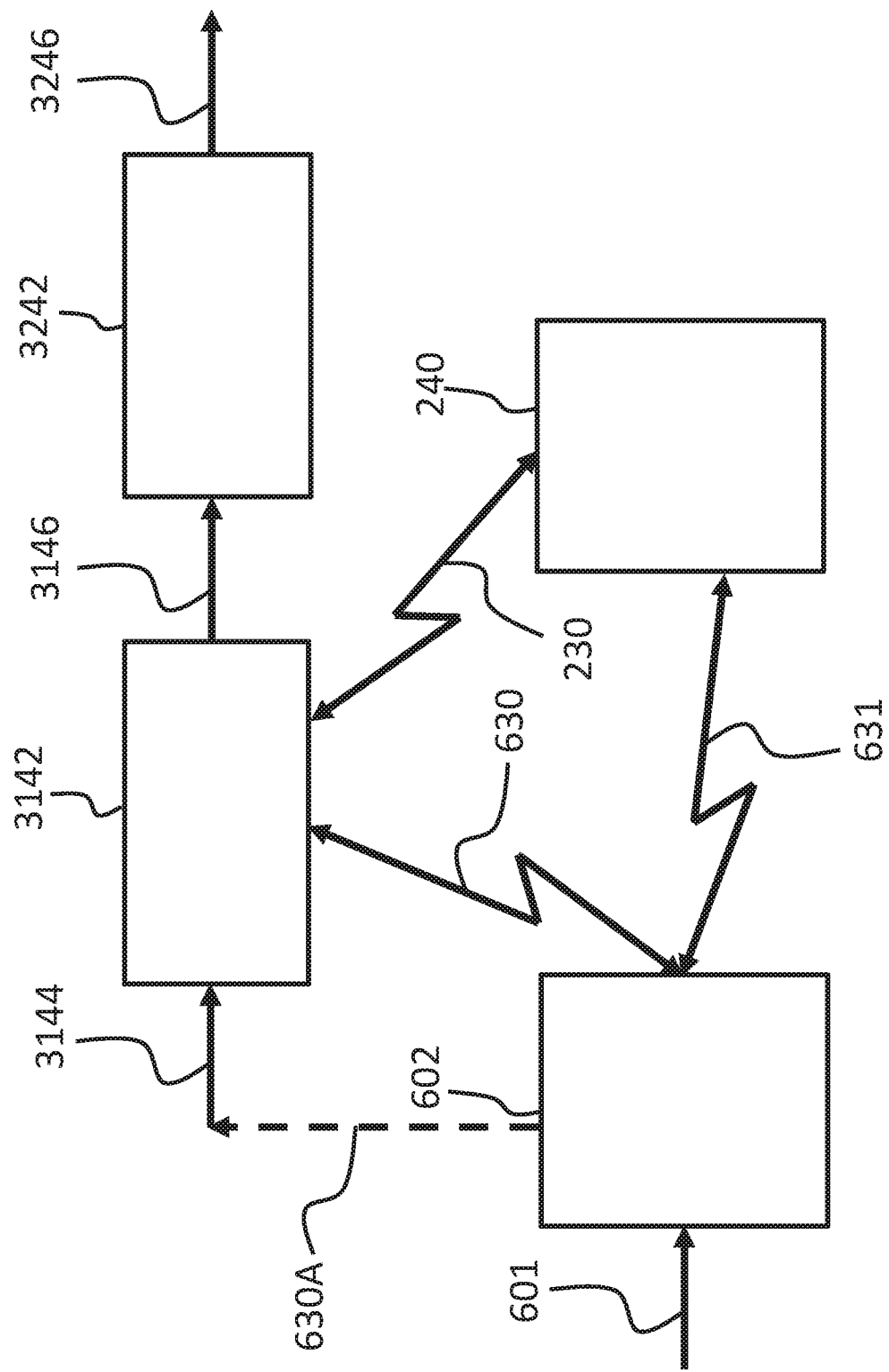
FIG. 6B presents another exemplary functional arrangement detailing communication between black boxes of the hearing prosthesis and a black box of the portable handheld device and a black box of a station.

As noted above, in an exemplary embodiment, the data that is analyzed by the portable handheld device 240 need not necessarily come from the hearing prosthesis 100. In this regard, FIG. 6B presents a variation of FIG. 6A, where link 631 is present between the media station 602 and the portable handheld device 240. In this regard, exemplary embodiments can be practiced without receiving data from the hearing prosthesis 100, at least the aforementioned data that is analyzed and utilized as the basis to present a display from a plurality of the displays.

Figure 7:
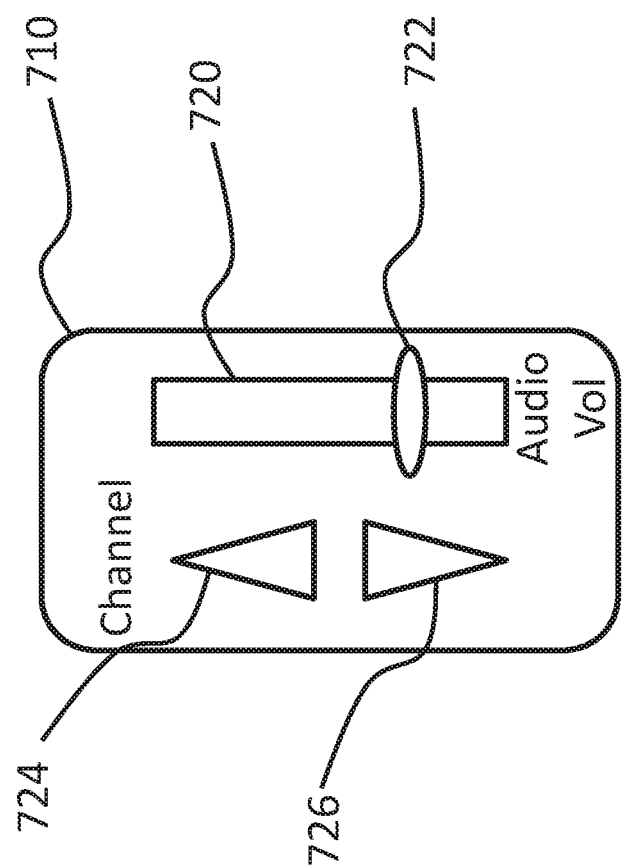
FIG. 7 presents another exemplary interface display that can be displayed on a display screen of the portable handheld device.

The observer will notice that link 631 (which can be a wireless link or a wired link) utilizes the dual arrowhead arrangement. In this regard, an exemplary embodiment entails a portable handheld device 240 that is configured to control the media station 602. More specifically, while the above exemplary displays have been presented in terms of displays presenting data related to the hearing prosthesis 100 and/or control options relating to the hearing prosthesis 100, in an alternate embodiment, the displays presented according to the teachings detailed herein can be displays related to componentry and/or phenomenon not directly associated with the hearing prosthesis 100. By way of example only and not by way of limitation, displays can be presented that enable control of the aforementioned media system. In this regard, FIG. 7 depicts an exemplary display 710, which includes a volume scrollbar 720 having an indicator 722 to control the audio volume of the audio input, and a channel controller having buttons 724 and 726 to enable the recipient to change channels. As with all of the displays detailed herein, these are exemplary. In at least some exemplary embodiments, an audio volume control would not necessarily be utilized in embodiments where the audio input was streamed directly to the hearing prosthesis 100.

Accordingly, in an exemplary embodiment, the portable handheld device 240 is configured to receive data (either from the hearing prosthesis or another source, such as the source of the audio input, which audio input is received by the portable handheld device 240) that is based on one or more features of an audio input from a media system received by the hearing prosthesis, the audio stream received by the prosthesis being utilized to evoke a hearing. In an exemplary embodiment, the media system is a television, a stable media player (MP3, CD, tape), a radio system, an internet system, etc. In an exemplary embodiment, the portable handheld device 240 is configured to automatically present a first interface display on the display 242 superseding a prior display displayed on the display based on the received data, the first interface display having a media system control (e.g., the display can be display 710), wherein the portable handheld device 240 is configured to receive input from the recipient via the display adjusting a control of the media system, and the portable handheld device is configured to output a signal to the media system instructing the media system to adjust a controllable feature based on the input.

By way of example only and not by way of limitation, the data received by the portable handheld device 240 could be the audio input (which could also be sent to the hearing prosthesis 100). The portable handheld device 240 can be configured to determine that the audio stream is indicative of a commercial or the like, and automatically present display 710 to enable the recipient to change the channel. Alternatively, the portable handheld device 240 can be configured to sense a volume of the audio stream, and determine that the recipient may seek to adjust the volume, and automatically present display 710 to enable the recipient to change the volume.

Accordingly, in view of the above, an exemplary embodiment can entail prioritizing a given app over other apps of the portable handheld device 240 based on the received data, such as prioritizing apps directly relating to the hearing prosthesis 100 (e.g., control apps, data display apps, etc.) and/or prioritizing apps indirectly related to the hearing prosthesis (e.g., the remote control app for the TV or another media station/system).

It is further noted that exemplary embodiments can be practiced where the received data (regardless of its source, whether it be from the hearing prosthesis 100 or another source) is based on data relating to an external component of the hearing prosthesis in communication with an implantable component of the hearing prosthesis. By way of example only and not by way limitation, the received data received by the portable handheld device 240 can be data relating to the type of the external device that is in communication with the implantable device (e.g., a charger unit, a data transmission unit, etc.). The data can be data directly relating to the external component (e.g., an identification code) or data that is indirectly related to the external component (e.g., data that can be extrapolated from the data).

Figure 2B:
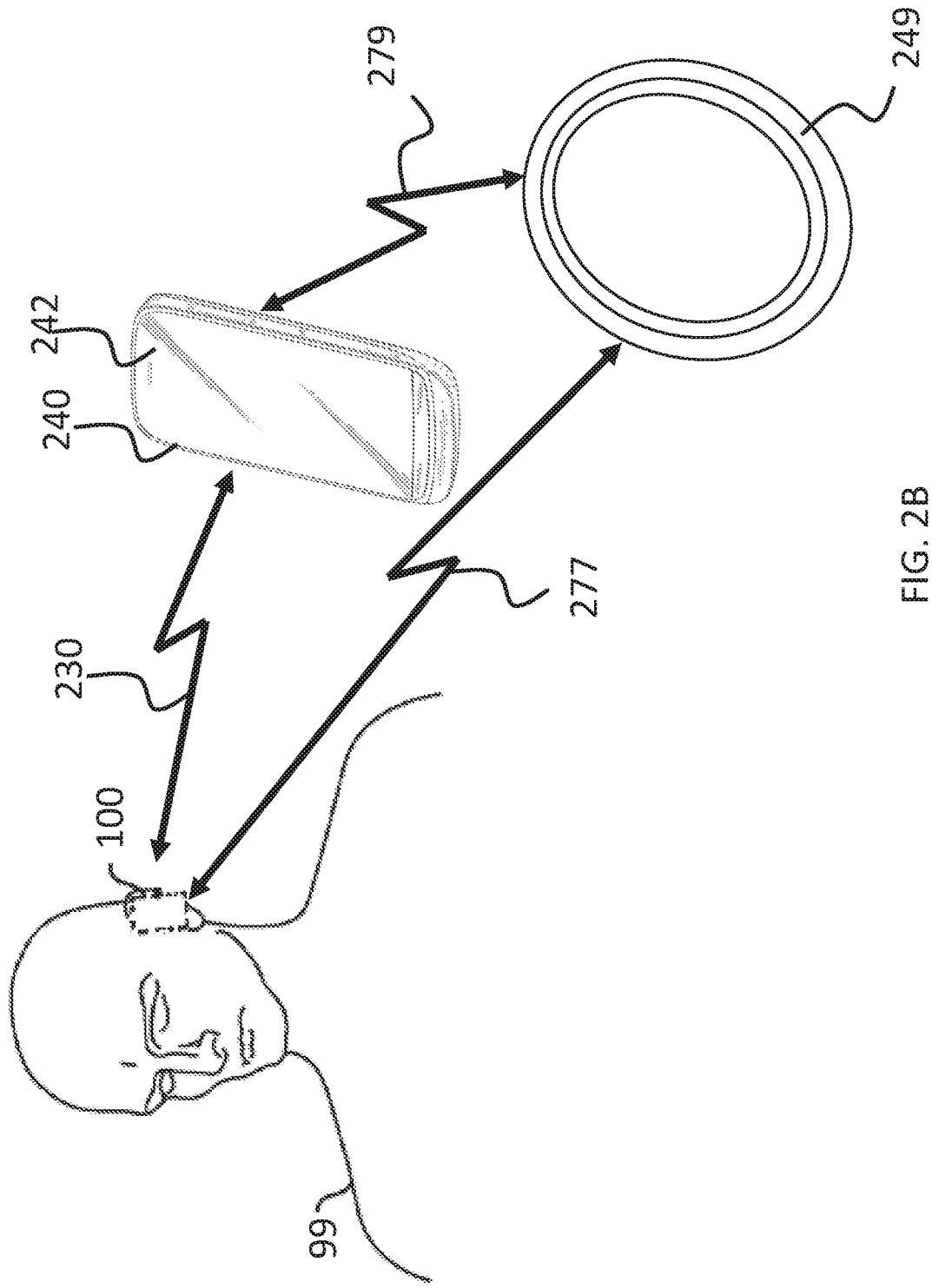
FIG. 2B presents an exemplary system including a hearing prosthesis and a remote device in the form of a portable handheld device, along with a wireless accessory in the form of a telecoil.

Corollary to this is that in an exemplary embodiment, the data can be data relating to a telecommunication infrastructure in communication with the hearing prosthesis. In this regard, the data can be indicative of the origin of an audio input (e.g., from cable television, Internet, radio wave transmission, laser beam transmission, room loop (where a telecoil is embedded or located within a floor, ceiling or wall, which telecoil transmits a signal to the hearing prosthesis 100, thereby providing audio input to the hearing prosthesis), etc.). By way of example only and not by way of limitation, if a telecoil signal is detected (e.g., the presence of a room loop signal is detected), an app that manages the hearing prosthesis 100's functionality with respect to telecoil input is prioritized (presented on display 242, superseding in at least some instances a previous display). In an exemplary embodiment, the display associated with the app for telecoil input includes a mixing ratio control, and on off control, and/or an auto telecoil mode, etc. FIG. 2B depicts an exemplary quasi-functional schematic depicting communication between an external audio source 249 (e.g., a telecoil), and the hearing prosthesis 100 and the handheld device 240 by way of links 277 and 279, respectively (note that FIG. 2B depicts two-way communication between the hearing prosthesis 100 and the external audio source 249, and between the handheld device and the external audio source 249—in alternate embodiments, the communication is only one way (e.g., from the external audio source 249 to the respective device)).

Still further, the data can be data relating to an ambient sound environment in which the hearing prosthesis 100 is located. By way of example only and not by way of limitation, the prosthesis 100 can include a so-called scene classifier that classifies a sound environment of the hearing prosthesis (e.g., quiet, large background noise content, city street, receipt of speech, etc.). Based on the analysis of the data associated with the ambient sound environment in which the hearing prosthesis is located, a given display can be presented so as to prioritize a given app/functionality. By way of example only and not by way of limitation, upon a determination that the recipient is in a sound environment having a large background noise content, the portable handheld device 240 can display a beamforming control application, which can enable the recipient to provide input into the portable handheld device to control the hearing prosthesis 100 to beamform (e.g., activate beamforming).

Still further, by way of example only and not by way of limitation, if the data is indicative of a sound environment classification that corresponds to a noisy or a quiet environment, the portable handheld device 240 can automatically present a display presenting various options for noise reduction, such that the election of a given option via input into the portable handheld device 240 will control the hearing prosthesis 100 to operate according to that elected option. By way of example only and not by way of limitation, the display can enable the recipient to increase or decrease or otherwise adjust the aggressiveness of a noise reduction algorithm. In a more advanced embodiment (e.g., an app for a more advanced recipient), a display can be presented to the recipient via display 242 that provides the recipient with the ability to adjust algorithm coefficients for one or more of strength, risetime, fall time, etc. Still further, by way of example only and not by way limitation, if the data is indicative of a speech content, a display can be presented to enable the recipient to adjust the functionality of the hearing prosthesis 100 through the portable handheld device 240 to a speech mode.

Also by way of example only and not by way of limitation, if the data is indicative of a sound environment corresponding to music, pertinent applications can be prioritized (e.g., a music identification app can be prioritized, a phone app can be prioritized, etc.). Still further, quiet is detected, other entertainment apps can be automatically presented on the display (e.g., games, electronic book app, etc.).

It is further noted that the data can be indicative of a transition from one sound environment to another sound environment. In this regard, a display can be presented that presents various options for adjusting various settings in recognition of the fact that the sound environment has changed.

It is noted that the aforementioned data can entail specific signals generated by the hearing prosthesis 100 containing specific data (e.g., data corresponding to the scene classification, the type of sound being captured, etc.). Alternatively or in addition to this, the aforementioned data can entail the signal of the sound and/or audio signal received by the hearing prosthesis. In this regard, a raw signal can be outputted from the hearing prosthesis 100, and the portable handheld device 240 can be configured to analyze that raw signal to implement the utilitarian teachings herein. By way of example only and not by way of limitation, the portable handheld device 240 can include the scene classifier functionality, where the portable handheld device 240 analyzes the raw audio signal from the hearing prosthesis 100 to classify the sound, and upon such classification of the sound, the pertinent display is presented.

In this regard, it is noted that the system 210 can be configured to execute one or more of the actions detailed herein, either by the hearing prosthesis 100 alone, the portable handheld device 240 alone, or by both together. In this regard, in an exemplary embodiment, the system 210 is configured to analyze an ambient sound environment in which the hearing prosthesis is located (and/or in which the recipient of the hearing prosthesis is located), and generate first data corresponding to the data received by the remote device (which data can be generated by the hearing prosthesis 100 and/or by the portable handheld device 240). The system 210 is further configured to automatically present a first interface display on the display 242 presenting a set of controls for the hearing prosthesis upon a result of the analysis that the ambient sound environment is a first type of sound environment. The system 210 is further configured to automatically present a second interface display on the display 242 presenting a set of controls for the hearing prosthesis upon a result of the analysis that the ambient sound environment is a second type of sound environment, wherein the second type of sound environment is different from the first type of sound environment. It is noted that while in at least some exemplary embodiments, it is the portable handheld device that is configured to control the automatic presentation of the aforementioned interface displays, in some other alternative exemplary embodiments, it is a hearing prosthesis that is configured to control the automatic presentation of the aforementioned interface displays. The latter exemplary embodiment can be implemented via the link 230, where the hearing prosthesis number 100 outputs a control signal to the portable handheld device 240, instructing the portable handheld device to present the display(s).

Indeed, in an exemplary embodiment, the portable handheld device 240 has one or more or all of the functionalities of the hearing prosthesis 100. Indeed, in an exemplary embodiment, the portable handheld device 240 can capture its own sound and process the sound accordingly (in at least some exemplary embodiments where the data is received elsewhere then from the hearing prosthesis 100). This is corollary to the exemplary embodiment of FIG. 6B, where the audio input is fed directly to the portable handheld device 240, thus corresponding to the aforementioned data that is analyzed to determine which display from the plurality of displays which will be presented.

While the above exemplary configurations have been presented in terms of a remote device in the form of a portable handheld device, in alternative embodiments, the device need not necessarily be a handheld device and/or need not necessarily be portable. In this regard, in an exemplary embodiment, the device could be a computer monitor or a TV screen alone or in communication with a computer. By way of example only and not by way limitation, the disclosures above and/or below with regard to the portable handheld device also correspond to a disclosure of a remote device including a display. Accordingly, in an exemplary embodiment, the remote device is configured to receive data from a hearing prosthesis and present an interface display on the display from among a plurality of different interface displays based on receive data from the hearing prosthesis. In an exemplary embodiment, the remote device can be a television (traditional cathode ray tube technology, LED, plasma, etc.). In this regard, in an exemplary scenario, the recipient could be in a room watching television when at least one of the aforementioned events occur, whereupon a display appears from amongst a plurality of displays on the television. In an exemplary embodiment, the display can be a sub window in the television screen. For example, while the recipient is watching a movie, the display can be a presented on the television scream overlaying a portion of the video. Alternatively and/or in addition to this, the video can be downsized to be located on one portion of the TV screen, and the display can be presented on the other portion of the screen. Indeed, such an arrangement can exist where the video is substantially downsized (e.g., takes up a quarter of the screen), and the display takes up the rest of the screen. This is somewhat analogous to the scenario that sometimes can be implemented utilizing modern cable/satellite television systems, where the video is downsized and pushed to a corner of the screen, and various options are located elsewhere on the screen. Corollary to this is that in at least some exemplary embodiments, the display can have an additional device, such as a control unit analogous to the so-called cable box that can communicate with the TV, which control unit is configured to control the television to display the aforementioned displays. Note further that the display can overlay the entire video (akin to the quasi-transparent volume scrollbar that appears on the TV screen when the user changes the volume thereof). It is further noted that the remote device can be a computer monitor, where upon the occurrence of a given scenario, the display from among said plurality of displays is presented on the monitor.

Is further noted that in an exemplary embodiment, the remote device can be utilized to control functionalities of the hearing prosthesis. In many exemplary embodiments, the remote device is a portable handheld device 240 is detailed above. In some alternative embodiments, the remote device is an interactive television or computer monitor. With respect to the latter example, a mouse—cursor combination can be utilized to adjust controls (e.g., move the scroll bar indicator of the volume control up or down by points, click and drag, utilization of the up-down-left-right arrow keys on a keyboard, and/or a touchscreen system (concomitant with the touchscreen examples detailed above with respect to the portable handheld device).)

In view of the above, in an exemplary embodiment, there is a system, such as system 210, that comprises a hearing prosthesis 100 including a stimulation device configured to be attached to a recipient and configured to evoke a hearing percept based on input, and a remote device including a display, such as portable handheld device 240, or the aforementioned TV and/or monitor, etc., where the remote device is or is not configured to be portable, but where the remote device is configured to communicate with the hearing prosthesis. In an exemplary embodiment, the system is configured to analyze data relating to the hearing prosthesis. In an exemplary embodiment, the remote device is configured to receive data from the hearing prosthesis. That said, in some alternate embodiments, the remote device is configured to receive data or other input that is also received by the hearing prosthesis (e.g., the remote device can be configured to capture sound in a manner the same as and/or similar to that of the hearing prosthesis), and analyze that data, as that data is data relating to the hearing prosthesis even though it does not come from the hearing prosthesis.

Still further, in an exemplary embodiment, the system is configured to present an interface display on the display from among a plurality of different interface displays based on the analysis.

With respect to the exemplary scenario detailed above, in an exemplary embodiment, the system 210 is configured to automatically present a first interface display on the display superseding a prior display displayed on the display based on the data, the first interface display having a hearing prosthesis volume control, wherein the remote device is configured to receive input from the recipient via the display adjusting the volume of the hearing prosthesis, and the remote device is configured to output a signal to the hearing prosthesis instructing the hearing prosthesis to adjust the volume based on the input. In an exemplary embodiment, the remote device receives input from the recipient via a touchscreen system. (That said, in an alternate embodiment, the display need not necessarily be used. Instead, the remote device is configured to receive input from the recipient via another mode of operation, such as via a microphone or the like, where the display is provided for the purposes of providing information regarding the current status of the hearing prosthesis as detailed above.)

The signal is outputted by the remote device via link 230 which connects the remote device 240 with the hearing prosthesis 100. When the signal is received by the hearing prosthesis, the hearing prosthesis adjusts the volume based on the input. In this manner, in an exemplary embodiment, the recipient can control the hearing prosthesis from the remote device, where the display that is presented as a result of the analysis of the data relating to the hearing prosthesis provides a control regime that enables the recipient to control the hearing prosthesis, relative to other possible displays there could be presented.

Still further, in an exemplary embodiment, the system 210 is further configured to automatically present a second interface display on the display superseding a prior display displayed on the display based on the data relating to the hearing prosthesis, the second interface display having a hearing prosthesis adaptive functionality control, such as a noise cancellation control, wherein the remote device is configured to receive input from the recipient via the display adjusting the adaptive functionality (e.g., noise cancellation feature) of the hearing prosthesis, and the remote device is configured to output a signal to the hearing prosthesis instructing the hearing prosthesis to adjust the adaptive functionality (e.g., noise cancellation system) based on the input.

It is noted that the second display can be presented in various temporal proximities to the display of the first display. For example, the first display can be displayed for five seconds, or shorter, or longer, and then the second display can be automatically displayed. Alternatively and/or in addition to this, after an adjustment is registered through the first display, the first display can be superseded by the second display within a given period of time (immediately, a fraction of a second thereafter, one second thereafter two seconds thereafter etc.). That said, the second display could be displayed prior to the first display, as the nomenclature second display is but a naming convention that does not indicate primacy. Still further, the first and second displays can be provided simultaneously via a split screen display or the like.

In at least some exemplary embodiments, it is the hearing prosthesis that is configured to analyze the data, and the remote device is configured to present an interface display on the display from among a plurality of different interface displays based on a signal pertaining to the analyzed data received from the hearing prosthesis. That said, alternatively or in addition to this, the remote device is configured to analyze the data relating to the hearing prosthesis and the remote device is configured to present an interface display on the display from among a plurality of different interface displays based on the analyzed data.

As noted above, in exemplary embodiments, the remote device is configured to present various displays independently of information received from the hearing prosthesis 100 (e.g., without receiving any information from the hearing prosthesis 100, at least information upon which the determination as to what display is to be displayed is based). In this regard, the remote device is configured to obtain input from a source other than the hearing prosthesis 100 and the remote device is configured to present an interface display on the display from among a plurality of different interface displays based on the input from the source other than the hearing prosthesis.

In view of the above, it will be understood that in at least some exemplary embodiments, the hearing prosthesis 100 and/or the remote device 240 has a modicum of processing capability. In this regard, in an exemplary embodiment, the hearing prosthesis 100 and/or the remote device 240 can include a respective processor (e.g. a CPU). In an exemplary embodiment, the processor(s) includes programming or is otherwise configured to execute the actions detailed herein. By way of example only and not by way limitation, a processor can include programming that executes an algorithm that entails receiving data relating to the hearing prosthesis, analyzing the data according to an if-then-else routine or the like to determine whether or not a given criteria has been met (e.g., that an audio input corresponds to a given type of music, that a sound environment corresponds to a given type of sound environment, etc., which can be executed continuously and/or semi-continuously in a background program). Based on the aforementioned analysis, the processor can then send instructions to control the display to display the given display from the plurality of displays. In an exemplary embodiment, the displays can be retrieved from the memory or the like or can be generated utilizing a graphics generator based on input.

Figure 8:
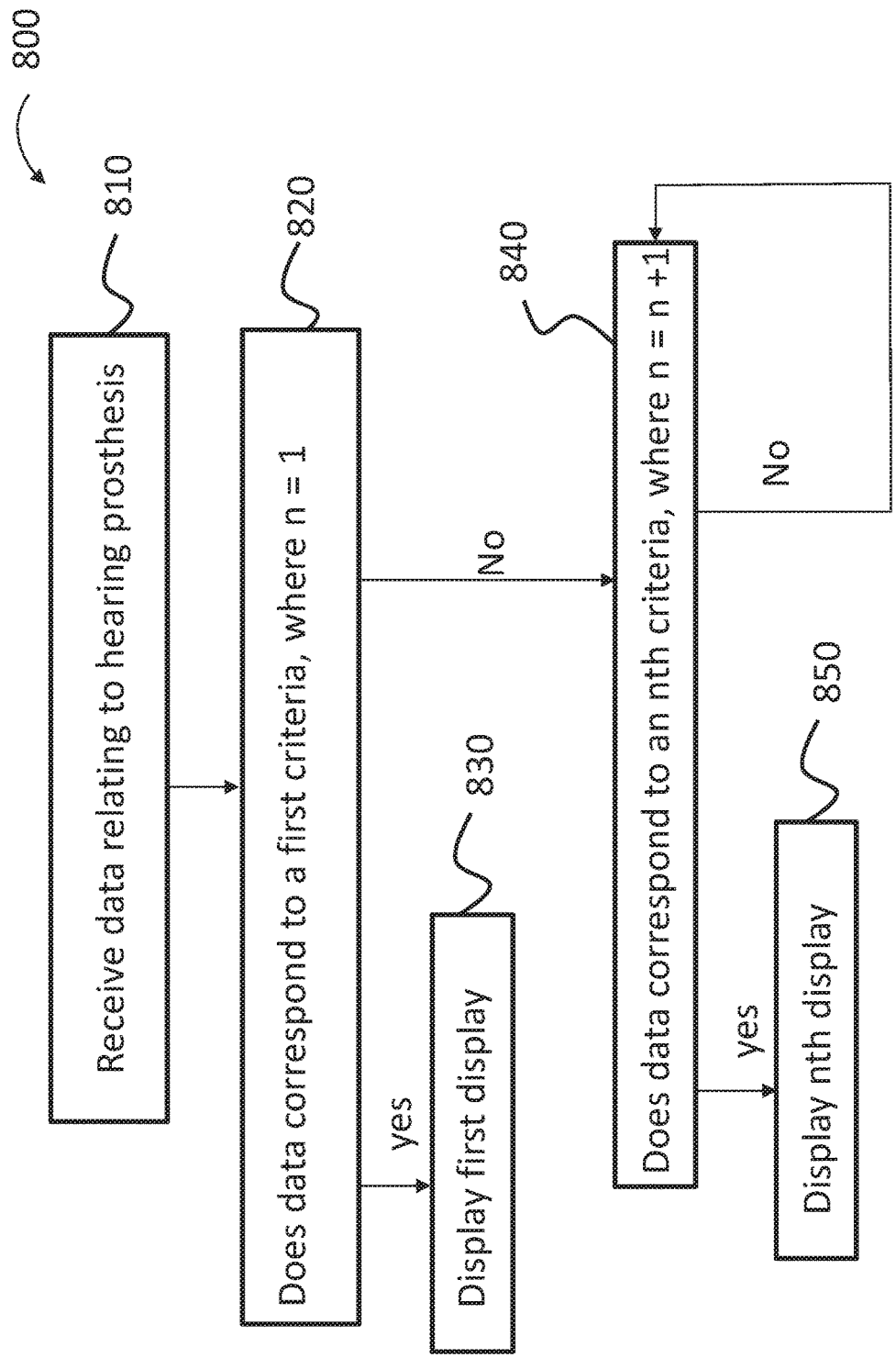
FIG. 8 presents an exemplary flowchart for an exemplary algorithm according to an exemplary embodiment.

More particularly, by way of example only and not by way of limitation, FIG. 8 presents an exemplary algorithm 800 according to an exemplary embodiment. As seen, the algorithm 800 includes method action 810, which entails receiving data relating to the hearing prosthesis. This can be performed by a processor in the hearing prosthesis and/or a processor in the remote device. Algorithm 800 includes method action 820, which entails determining whether the received data corresponds to a first criteria, with an indicator n=1. If the determination is yes, the algorithm proceeds to method action 830, which entails displaying a first display. If the determination is no, the algorithm proceeds to method action 840, which entails determining whether the data corresponds to an nth criteria, where n=n+1. If a determination is yes, the method proceeds to 850, which entails displaying the nth display. If a determination is no, the method proceeds back to method action 840, where the indicator increases by 1, and the process is repeated.

In at least some exemplary embodiments, the data relating to the hearing prosthesis is related to a mode and/or an accessory feature of the hearing prosthesis. In an exemplary embodiment, as briefly noted above, the hearing prosthesis can be a multimode hearing prosthesis, such as the Cochlear LTD Hybrid system. The multimode system can operate in a unimode mode or in a multimode mode, where the former, only one of the multimode is utilized, while in the latter, two or more of the multimode modes are utilized. In this regard, the associated displays can be different depending on what mode in which the multimode hearing prosthesis is utilized. By way of example, in a scenario where two or more modes are utilized, two different volume controls can be presented on a given display, one set of controls being a volume control for the first mode (e.g., a cochlear implant mode) and a second set of controls for the second mode (e.g., an acoustic mode, a mechanical mode, etc.). Conversely, in a scenario where only one of the modes are utilized, one given display for a volume control can be different than another given display for a volume control. Moreover, different displays can have different control features depending on which mode is being utilized. That is, the display for one mode can be different than a display for another mode, and if only one mode is being utilized, the system only displays one display versus the other display. Accordingly, in an exemplary embodiment, the hearing prosthesis is a multimode hearing prosthesis, the data is data indicative of the hearing prosthesis being utilized in one or more modes, and the system is configured to automatically prioritize interface displays on the display from among a plurality of different interface displays based on the received data from the hearing prosthesis.

Note further that in an exemplary embodiment, a display presenting a mix ratio control or otherwise presenting mix ratio data can be presented on the display 242 upon a determination that the hearing prosthesis 100 is being utilized in the multimode mode.

It is noted that by prioritize, it is meant that one or more displays are either presented prior to one or more other displays, or the system is configured such that the recipient is provided with an array of icons to select one or more displays, where some icons for respective displays are placed in a more prominent location than other icons (e.g., first on a list, centered, provided with a larger icon relative to others, etc.). It is noted that the aforementioned prioritization is not limited to the utilization of multimode devices/data relating to a mode of a multimode device. Prioritization can be utilized with any applicable scenario detailed herein and/or variations thereof, providing that such can be enabled or otherwise provide utilitarian results.

Moreover, in view of the above, in an exemplary embodiment, the multimode hearing prosthesis includes a first sub-system corresponding to a cochlear implant and a second sub-system configured to evoke a hearing percept based on a different principle of operation from that of the cochlear implant (acoustic/traditional hearing aid, mechanical (e.g., middle ear implant), etc.). In an exemplary embodiment, the system is configured to automatically present a first interface display on the display prioritizing a set of controls for one of the first sub-system or the second sub-system upon an automatic determination by the system that the hybrid hearing prosthesis is being utilized in a first mode, and the system is configured to automatically present a second interface display on the display prioritizing a set of controls for the other of the first sub-system or the second sub-system upon an automatic determination by the system that the hybrid hearing prosthesis is being utilized in a second mode different from the first mode. In this regard, in an exemplary embodiment, the algorithm of FIG. 8 can be utilized to implement this configuration, although other algorithms can be utilized as well.

Still further, continuing with the above exemplary embodiment having the first and second sub-systems, in an exemplary embodiment, the first mode is a mode in which both the first sub-system and the second sub-system are utilized to evoke a hearing percept (i.e., true multimode operation), at the time of the analysis of the data, and the second mode is a mode in which only one of the first sub-system or the second sub-system is utilized to evoke a hearing percept at the time of the analysis of the data.

It is further noted that in at least some exemplary embodiments, displays can be presented that enable the sensitivity and/or gain of a given mode to be adjusted. Note further that such an exemplary embodiment is not limited to the multimode hearing prosthesis. Sensitivity and/or gain adjustment displays can be presented utilizing a traditional single mode hearing prosthesis based on the aforementioned data.

Still further, in an exemplary embodiment, as noted above, the systems according to at least some embodiments can utilize data associated with accessories being utilized with the hearing prosthesis 100. In this regard, with respect to the multimode hearing prosthesis, such multimode hearing prostheses include so-called multimode accessories, which may or may not be utilized with the multimode hearing prosthesis in some scenarios. Accordingly, any of the aforementioned prioritizations and/or automatic displays of displays can be executed based on data relating to the multimode accessory.

Note further that while in at least some exemplary embodiments, the mode in which the hearing prosthesis is operated can be determined automatically, in some other alternative exemplary embodiments, the mode in which the hearing prosthesis is operated can be inputted by input from the recipient. That is, the recipient could input data into the remote device 240 indicating what mode of operation in which the hearing prosthesis is being operated. This input can correspond to the received data received by the system. Still further, the recipient could input data into the hearing prosthesis. By way of example only and not by way of limitation, the recipient could speak a command phrase or data phrase that is picked up by the hearing prosthesis, which is then relayed to the portable handheld device 240. In this regard, the received data is received from the hearing prosthesis. Note further that the portable handheld device 240 can be configured to receive voice data as well. Any arrangement that can enable the teachings detailed herein and/or variations thereof to be practiced can be executed in at least some embodiments.

Briefly, it is noted that in another exemplary mode of operation, the hearing prosthesis can be operated with respect to a different environmental mode of operation. By way of example only and not by way of limitation, some exemplary hearing prostheses have a water mode of operation, which enables the recipient to utilize the hearing prosthesis for swimming. Different displays can be presented and/or prioritized accordingly. In this regard, in an exemplary embodiment, different displays having the same functionality can be presented with a different theme (e.g., a water background when in the water mode, a different color theme, etc.). As with the various modes of operation, in an exemplary embodiment, the hearing prosthesis and/or the remote device 240 can be configured to automatically determine whether or not the hearing prosthesis is in the water mode. By way of example only and not by way of limitation, the hearing prosthesis can be configured to determine whether or not a given water mode accessory is being utilized with the hearing prosthesis, and thus provide that data to the remote device.

Note further that in at least some exemplary embodiments, data indicating that the hearing prosthesis 100 is being utilized in a water mode can be the basis upon which a water mode display is presented, or, alternatively and/or in addition to this, a display is presented having features that are statistically related to the use of the hearing prosthesis and a water mode. By way of example only and not by way of limitation, if the system "learns" that the recipient often adjusts the sensitivity of the hearing prosthesis in close temporal proximity to the hearing prosthesis being placed into the water mode (or in close temporal proximity to the receipt of data associated with the hearing prosthesis 100 being utilized in a water mode (e.g., data indicating that a waterproof shield has been placed about at least a portion of the hearing prosthesis)), a display enabling the recipient to adjust the sensitivity (or a display presenting data relating to the sensitivity) is automatically displayed.

Some exemplary methods will now be detailed in terms of a smartphone including a touchscreen. It is noted that all disclosures associated with the following methods also correspond to a disclosure of an apparatus for executing those methods (e.g., a smart phone). Still further, it is noted that any disclosure herein relating to a smart phone corresponds to a disclosure of any other device that can be utilized to implement the teachings associated with these methods (e.g., a non-phone device, a personal computer, etc.).

Figure 9:
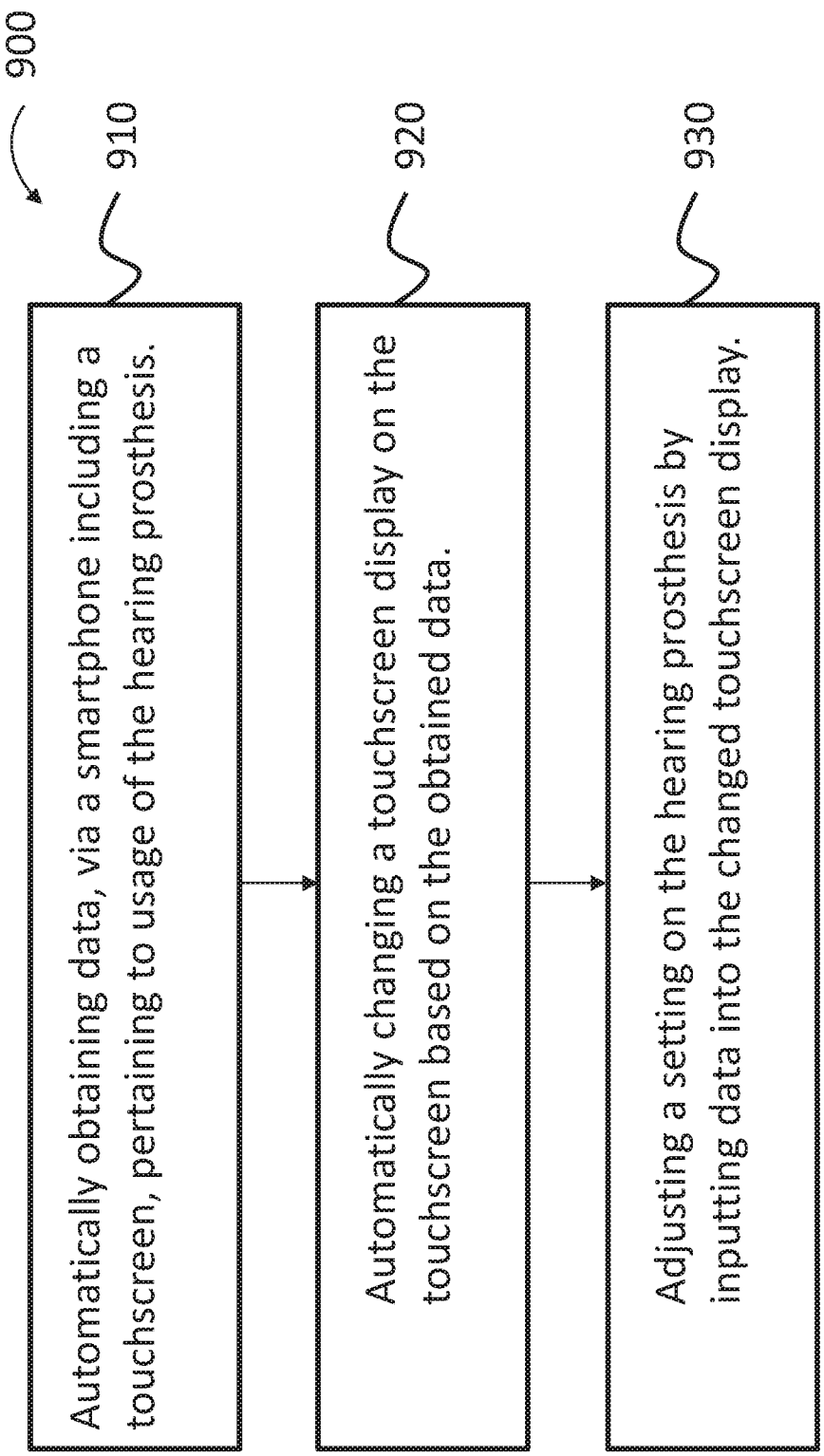
FIG. 9 presents another exemplary flowchart for another exemplary algorithm according to an exemplary embodiment.

Now with reference to FIG. 9, there is an exemplary algorithm 900, which includes method action 910, which entails automatically obtaining data, via a smartphone (e.g., portable handheld device 240) including a touchscreen 242, pertaining to usage of the hearing prosthesis 100. In an exemplary embodiment, this action can be executed based on data transmitted from the hearing prosthesis 100 to the portable handheld device 240 via link 230. Alternatively and/or in addition to this, this action can be executed based on input from the recipient into the smart phone. Method 900 further includes method action 920, which entails automatically changing a touchscreen display on the touchscreen based on the obtained data, and method action 930, which entails adjusting a setting on the hearing prosthesis by inputting data into the changed touchscreen display. Method action 930 can be executed by touching the display with one's finger, etc. By way of example only and not by way limitation, if display 310 is presented, the recipient can move the indicator 322 upwards to increase the volume or move indicator 322 downwards decrease the volume by first putting his or her fingertip over the indicator 322 and then moving his or her fingertip upwards or downwards across the screen. It is noted that while the embodiments detailed herein are often disclosed in terms of a touchscreen display, any disclosure of such also corresponds to a regular non-touchscreen display, at least if such can enable the teachings detailed herein. Further, any disclosure herein relating to inputting data via a touchscreen display also corresponds to a disclosure of utilizing conventional buttons, knobs, etc., to input the data.

It is noted that while many of the exemplary scenarios detailed herein are related to quasi-instantaneous features associated with the hearing prosthesis (e.g., a current sound environment, current operating mode, etc.), in some exemplary scenarios, the data relating to the usage of the hearing prosthesis is more temporally disassociated. In this regard, by way of example only and not by way limitation, in an exemplary embodiment, the data pertaining to usage of the hearing prosthesis obtained in method action 910 includes data corresponding to different periods of the recipient's hearing journey with the hearing prosthesis. In this regard, a recipient of the hearing prosthesis becomes better acquainted with the hearing prosthesis over time. Corollary to this is that the utilitarian value of the hearing prosthesis to a recipient increases with time, as the recipient becomes more comfortable or otherwise becomes more accustomed with the hearing prosthesis. In this regard, in some scenarios, control features and/or data relating to the hearing prosthesis that are desirable or otherwise frequently accessed by a recipient during the recipient's initial portion of the recipient's hearing journey become less desirable and/or otherwise less frequently accessed, while other control features and/or data relating to the hearing prosthesis become more desirable or otherwise frequently accessed, as the recipient precedes the hearing journey. That said, in some scenarios, the control features and/or data relating to the hearing prosthesis remain desirable and/or otherwise are relatively accessed with the same frequency, but the recipient desires additional control features and/or additional data as the hearing journey progresses.

Thus, in an exemplary embodiment, action 920, the action of automatically changing a touchscreen display, entails changing the touchscreen display from a first touchscreen display to a second touchscreen display having more complexity than the first touchscreen display. In this regard, because the recipient has become more comfortable or otherwise accustomed to the utilization of the hearing prosthesis, additional control features and/or additional data inputs will not overwhelm the recipient or otherwise will be less likely to overwhelm the recipient relative to that which would be the case at the start of the hearing recipient's journey, etc. In this regard, the more complex touchscreen display can entail providing the recipient with more advanced controls of the hearing prosthesis on the display. Still further, the more complex touchscreen can enable the recipient to change features that might otherwise not be advisable to be changed at the start of the recipient's hearing journey. By way of example only and not by way of limitation, a more complex display can include a display that enables the recipient to change a map of the hearing prosthesis and/or otherwise make adjustments to a given map of the hearing prosthesis. Still further by way of example, the more complex displays can permit the recipient to enable different accessories (e.g., different wireless accessories, etc.). The idea here is that the automatic changing of the touchscreen display based on data pertaining to the usage of the hearing prosthesis can be utilized to more closely correlate the complexities of a given display with the recipient's ability to use the features associated therewith, where a correlation generally exists with respect to the location of the recipient and his or her hearing journey. In an exemplary embodiment, the location of the hearing journey can be determined based on time from the beginning of use of the hearing prosthesis and/or from the beginning of use of the remote device with the hearing prosthesis.

Accordingly, in an exemplary embodiment, the data pertaining to usage of the hearing prosthesis obtained in method action 910 includes first data corresponding to a first temporal period and second data corresponding to a second temporal period, the first temporal period being temporally closer in time to an implantation date of the hearing prosthesis in the recipient than the second temporal period of time. In an exemplary embodiment, the method further comprises comparing the second data to the first data. This can be done between method actions 910 and 920. Still further, by way of example only and not by way of limitation, method action 920, the action of automatically changing a touchscreen display, entails changing the touchscreen display from a first touchscreen display to a different touchscreen display based on the comparison of the second data to the first data. Still further, according to another exemplary embodiment, the end with respect to the temporal data obtained in method action 910 relating to the first and second temporal periods, the action of automatically changing a touchscreen display, method action 920 entails adding applications to the touchscreen display based on the comparison of the second data to the first data, wherein the added features were previously unavailable prior to the comparison, concomitant with advancement of the recipient's hearing journey.

While the embodiments detailed above in at least some instances utilize temporal periods to determine or otherwise gauge the progress along the recipient's hearing journey, other proxies can be utilized, such as the type of applications that the recipient accesses that are related to the hearing prosthesis. In this regard, the remote device/portable handheld device 240 (or hearing prosthesis, or other device for that matter) can be configured to compile data associated with how often a recipient accesses a given function or otherwise changes a given display or accesses a given display or just a given feature, etc. The remote device can further be configured to evaluate the compiled data and adjust or otherwise manipulate displays according to the teachings detailed herein and/or variations thereof accordingly. By way of example only and not by way of limitation, the portable handheld device 240 and/or the hearing prosthesis 100 or any other device or system can be configured to reorder a user interface of a given display dynamically based on the number of times a function was used or otherwise adjusted, which number can be based on how often the adjustment was made via access through the hearing prosthesis or through the remote device, or through another device. That is, the function need not necessarily be directly related to a function accessed through the portable handheld device. For example, if the recipient frequently changes a volume of the hearing prosthesis 100 via local control thereof (e.g., a volume control on a behind-the-ear device) this could be used as a basis to develop or otherwise change a given display. Again, in keeping with the longer-term temporal nature of this feature of the system, these changes are not based on immediate changes, but they are based on analytics over a longer period of time (e.g., a statistically significant period of time). By way of example only and not by way of limitation, in an exemplary scenario, the existing main hearing prosthesis control display can be changed, which display can be presented on display 422. This main display can include a plurality of control features. In an exemplary embodiment, the system is configured to determine how often a given control feature is accessed. The given control features can be ordered based on the amount of times that a given control feature is accessed (e.g., given a more prominent location in the aforementioned array, etc.). Alternatively and/or in addition to this, some functions can be added to the main display while other functions can be eliminated from the main display, or otherwise pushed to a secondary or tertiary display, etc., based on the access frequencies associated with that function.

More particularly, in an exemplary embodiment, the system 210 (the hearing prosthesis 100 and/or the portable handheld device 240) is configured to provide progressive availability of user functions and/or stimulation levels based on the number of times a function was utilized. By way of example only and not by way of limitation, in an exemplary embodiment, the system is configured to measure the number of times that a function is utilized or otherwise accessed, and compare such against a metric (e.g., a statistically significant value), and move the recipient on to other functions once a quantitative and/or a qualitative value pertaining to a given metric is met (e.g., a measure associated with the use of these functions has reached a given level, such as a predetermined level). In this regard, in an exemplary embodiment, progressive maps (e.g., maps that build upon the prior map, maps that are designed to be used after a recipient has grown comfortable with the current map, etc.) can be provided to the recipient via the presentation of different displays according to the teachings detailed herein. For example, upon a determination that the recipient has grown accustomed to utilizing a given function based on some predetermined metric, new displays can be presented that provide additional functions that are related to that function but provide a greater ability to control or otherwise fine-tune a given feature.

It is further noted that the aforementioned metrics need not necessarily be programmed or otherwise pre-set into the system 210. In an exemplary embodiment, the system can communicate with a remote location via the Internet or the like. Data relating to user functions can be transmitted from the system 210 to the remote location, where it is analyzed. The aforementioned presentation of new displays/development of new displays/prioritization of various functions can be controlled or otherwise developed at the remote location, and communicated to the system 210 via the Internet link (or any other utilitarian link). Such remote communications are described in greater detail below.

Still further, in an exemplary embodiment, the number of times a given function was utilized or otherwise accessed can be utilized as a proxy to determine whether or not there can be utilitarian value with respect to adjusting other features of the system 210. By way of example only and not by way of limitation, in an exemplary embodiment, if the recipient is deemed to be changing the volume of the hearing prosthesis 100 a lot (e.g., over a statistically significant number), this can be indicative of a scenario where there might be utilitarian value with respect to changing or otherwise adjusting/updating the mapping of the hearing prosthesis 100. In this regard, system 210 could automatically present or provide the recipient with a remote mapping display, so that the recipient can enable a remote clinician to adjust the map, or even present a self-mapping display, where the recipient can make adjustments to the map of the hearing prosthesis via the remote device (such might be limited to a relatively advanced recipient/a recipient who has a lot of experience with the hearing prosthesis 100). Alternatively and/or in addition to this, the system 210 could present the recipient with a scheduling display, which enables the recipient to schedule an appointment with a clinician or the like to adjust the map. It is noted that these displays could be presented automatically to override any existing display, or could be automatically presented when a recipient accesses a given app (e.g., the display is not present until the recipient accesses a given application).

It is noted that the aforementioned data relating to the number of times that a given function was accessed can be obtained both from the hearing prosthesis 100 and the portable handheld device 240. That is, in some scenarios, the recipient may be more comfortable changing the volume of the hearing prosthesis 100 via the hearing prosthesis 100 itself, as opposed to utilizing the portable handheld device 240. Accordingly, the hearing prosthesis 100 can be configured to collect data associated with a number of times that the volume or other function is accessed or otherwise changed, and provide that data to the remote device 240 and/or provide such to the remote location through the Internet (again as will be further detail below).

Accordingly, in view of the above, exemplary embodiments of the system 210 are configured to display different displays based on the number of times that a given function is utilized, where different displays are presented depending on the number of times that a function is utilized, adjusted, etc.

Accordingly, in an exemplary embodiment, the data pertaining to usage of the hearing prosthesis obtained in method action 910 includes quantitative data relating to a function presented on a touchscreen display prior to method action 920 (the action of automatically changing the touchscreen display). Still further, in an exemplary embodiment, method 900 further comprises analyzing the quantitative data (e.g., using the algorithm of FIG. 8), wherein the action of automatically changing the touchscreen display, method action 920, entails changing the touchscreen display from a first touchscreen display to a different touchscreen display based on the analysis of the quantitative data. By way of example only and not by way of limitation, the first touchscreen display can include a feature relating to the aforementioned function, which feature is not located on the second display because the analysis of the quantitative data determined that that feature was used less often than other features presented on the second display. Still further, by way of example only and not by way of limitation, the action of changing the touchscreen display, method action 920, from the first touchscreen display to the different touchscreen display entails reordering respective functions displayed on the touchscreen display, including the function presented on the touchscreen display prior to the action of automatically changing the touchscreen display. Again, as noted above in the exemplary example, the function presented on the touchscreen display can be moved from a location of primacy in an array (e.g., from first to last, etc.).

Still further, in an exemplary embodiment, the data that is obtained in method action 910 is data that entails first data including first quantitative data linked to first qualitative data. In a variation of method 900, the method further comprises analyzing the first data. In this exemplary method, the action of automatically changing the touchscreen display, method action 920, entails changing the touchscreen display from a first touchscreen display to a second touch screen display based on the analysis of the first data. This exemplary method further comprises subsequently: (1) automatically obtaining second data, via the smartphone, pertaining to usage of the hearing prosthesis 100, the second data including one of first qualitative data linked to second quantitative data or second quantitative data linked to first qualitative data; (2) analyzing the second data and (3), automatically changing the touchscreen display from the second touchscreen display to a third touch screen display based on the analysis of the second data.

Moreover, display adjustment and/or prioritization of functionalities can be based on how quickly a function is changed and/or how recently a function is changed. With respect to the former, in an exemplary embodiment, the system can automatically provide functions on the display that are needed based on how quickly a function is changed. In at least some exemplary embodiments, this data can be combined with an analysis of the sound environment in which the hearing prosthesis 100 and/or the recipient is located. By way of example, a volume and/or map that is changed relatively quickly when going into a new sound environment can indicate that the clinical mapping was not as utilitarian as otherwise could be the case. In an exemplary embodiment, the system 210 can be configured to analyze the temporal aspects of the changes related to a given function, and if the temporal aspects correspond to a predetermined value or range of values, the system could present a new display. By way of example only and not by way of limitation, with respect to the aforementioned scenario where the volume is being changed, the remote mapping display can be automatically presented and/or the appointment display can be presented to enable the recipient to schedule an appointment with the clinician (this could be done immediately, thus superseding any current display, or upon the recipient accessing a given app, concomitant with the examples presented above).

Corollary to the above, the data can be so-called "panic data." In this regard, the system 210 can be configured to analyze usage of the system 210, and determine that the recipient is "panicking" in certain scenarios. By "panicking," it is meant that the recipient is reacting in a very quick manner to stop something that is occurring. The system 210 can analyze this data and present utilitarian displays accordingly.

With respect to the utilization of the recency of a change in a function, in a scenario where a determination is made that control components on the hearing prosthesis 100 are accessed, and then the mobile device 240 is subsequently accessed in relatively close temporal proximity to the access to the control components on the hearing prosthesis 100, a display can be automatically presented that enables the recipient to adjust the operation of the hearing prosthesis based on the expectation that the recipient is accessing the mobile device to make further adjustments to the operation of the hearing prosthesis in view of the close temporal proximity of the access to the mobile device. Alternatively, and/or in addition to this, a setup interface display can be presented or otherwise prioritized. By way of example only and not by way of limitation, if at time T1, the recipient makes an adjustment to the volume on the hearing prosthesis 100, and then at time T2 following time T1, the recipient accesses the portable handheld device 240, the difference between time T1 and time T2 falling within a predetermined range, a given display is automatically presented on the portable handheld device 240, which can supersede another display currently present thereon at time T1, or which would otherwise be present at time T2. In an exemplary embodiment, the display presented at time T2 could be an application to change the mixing ratios of the hearing prosthesis 100. Still further by way of example, if at time T1, the recipient makes an adjustment to a noise control/noise management program on the hearing prosthesis 100, and then at time T2, following time T1, the recipient accesses the portable handheld device 240, where the difference between the two times falls within a predetermined range (which could be different than the aforementioned predetermined range, depending on what function of the hearing prosthesis 100 is accessed), a display for an application to enable the change in the noise reduction algorithm parameters of the hearing prosthesis can be automatically presented, again which can supersede another display currently present at time T1 or which would otherwise be present at time T2.

Note further that the temporal aspects associated with making a change to the functionality of system 210 can also be linked to the nature of the change. In this regard, if, for example, the remote device 240 is utilized to override an input control inputted directly to the hearing prosthesis 100, in relatively close temporal proximity to the input, this can be an indication that settings of the hearing prosthesis 100 are not as utilitarian as they otherwise might be. In this regard, the remote fitting application and/or the appointment display and/or a self-fitting application can be presented on a new interface display based on data relating to the aforementioned qualitative and quantitative facts.

Accordingly, in an exemplary embodiment, the action of automatically obtaining data, action 910, entails receiving first temporally based data from the hearing prosthesis regarding control input into the hearing prosthesis and obtaining second temporally based data regarding hearing prosthesis control input into the smartphone. Still further, this exemplary embodiment includes the method action of analyzing the obtained first temporally based data and second temporally based data, and upon a determination that the first temporally based data and the second temporally based data have temporal features falling within a predetermined range, automatically changing the touchscreen display on the touchscreen to provide hearing prosthesis controls. In some exemplary embodiments, the action of automatically changing the touchscreen display on the touchscreen to provide hearing prosthesis controls entails serially prioritizingly presenting a volume control display and then a mix control display.

Figure 10:
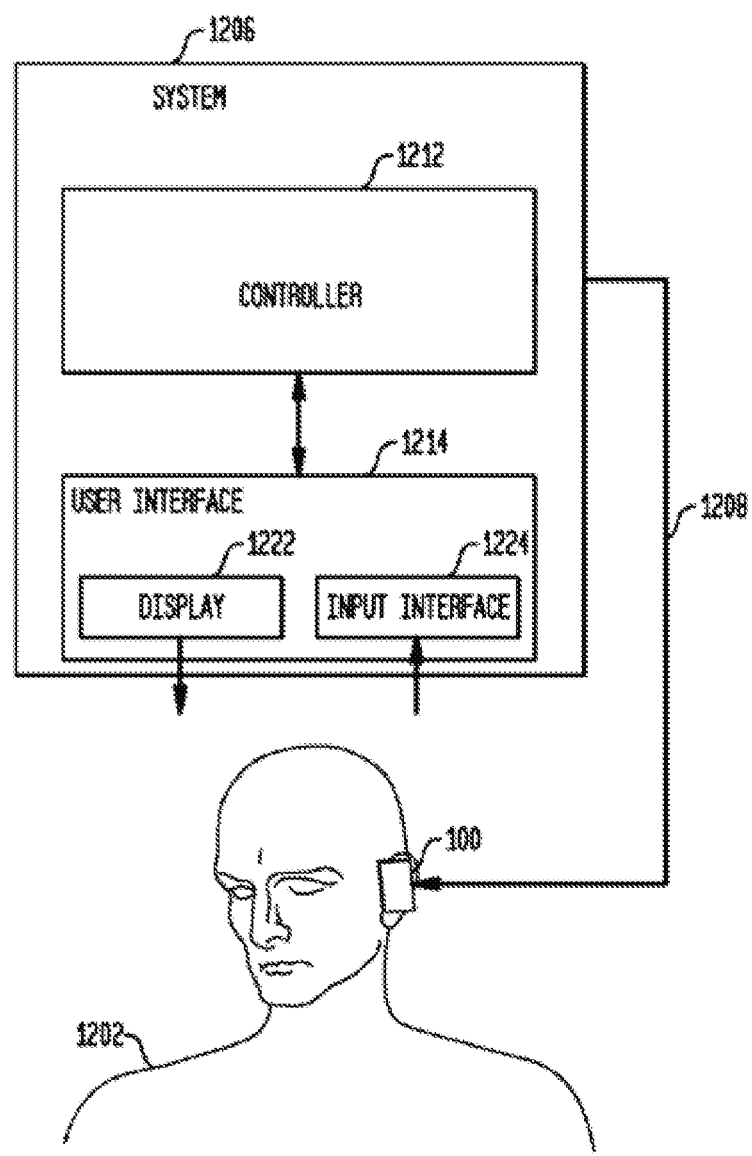
FIG. 10 presents an exemplary functional schematic of an exemplary system according to an exemplary embodiment.

FIG. 10 presents a functional schematic of a system with which some of the teachings detailed herein and/or variations thereof can be implemented. In this regard, FIG. 10 is a schematic diagram illustrating one exemplary arrangement in which a system 1206 can be used to execute one or more or all of the method actions detailed herein in conjunction with the use of a hearing prosthesis 100. System 1206 will be described, at least in part, in terms of interaction with a recipient. In an exemplary embodiment, system 1206 is a recipient controlled system. In an exemplary embodiment, system 1206 can correspond to the remote device 240, which, as detailed above, can be a portable handheld device, and/or can be a personal computer, etc.

In an exemplary embodiment, system 1206 can be a system having additional functionality according to the method actions detailed herein. In the embodiment illustrated in FIG. 10, the hearing prosthesis 100 can be connected to system 1206 to establish a data communication link 1208 between the hearing prosthesis 100 and system 1206. System 1206 is thereafter bi-directionally coupled by a data communication link 1208 with hearing prosthesis 100. Any communications link that will enable the teachings detailed herein that will communicably couple the implant and system can be utilized in at least some embodiments.

System 1206 can comprise a system controller 1212 as well as a user interface 1214. Controller 1212 can be any type of device capable of executing instructions such as, for example, a general or special purpose computer, a handheld computer (e.g., personal digital assistant (PDA)), digital electronic circuitry, integrated circuitry, specially designed ASICs (application specific integrated circuits), firmware, software, and/or combinations thereof. As will be detailed below, in an exemplary embodiment, controller 1212 is a processor. Controller 1212 can further comprise an interface for establishing the data communications link 1208 with the hearing prosthesis 100. In embodiments in which controller 1212 comprises a computer, this interface may be, for example, internal or external to the computer. For example, in an exemplary embodiment, controller 1206 and cochlear implant may each comprise a USB, Firewire, Bluetooth, Wi-Fi, or other communications interface through which data communications link 1208 may be established. Controller 1212 can further comprise a storage device for use in storing information. This storage device can be, for example, volatile or non-volatile storage, such as, for example, random access memory, solid state storage, magnetic storage, holographic storage, etc.

User interface 1214 can comprise a display 1222 and an input interface 1224 (which, in the case of a touchscreen of the portable device, can be the same). Display 1222 can be, for example, any type of display device, such as, for example, those commonly used with computer systems. In an exemplary embodiment, element 1222 corresponds to a device configured to visually display a plurality of words to the recipient 1202 (which includes sentences), as detailed above.

Input interface 1224 can be any type of interface capable of receiving information from a recipient, such as, for example, a computer keyboard, mouse, voice-responsive software, touchscreen (e.g., integrated with display 1222), microphone (e.g. optionally coupled with voice recognition software or the like) retinal control, joystick, and any other data entry or data presentation formats now or later developed. It is noted that in an exemplary embodiment, display 1222 and input interface 1224 can be the same component, e.g., in the case of a touch screen). In an exemplary embodiment, input interface 1224 is a device configured to receive input from the recipient indicative of a choice of one or more of the plurality of words presented by display 1222.

It is noted that in at least some exemplary embodiments, the system 1206 is configured to execute one or more or all of the method actions detailed herein, where the various sub-components of the system 1206 are utilized in their traditional manner relative to the given method actions detailed herein.

In an exemplary embodiment, the system 1206, detailed above, can execute one or more or all of the actions detailed herein and/or variations thereof automatically, at least those that do not require the actions of a recipient.

While the above embodiments have been described for the most part in terms of the portable handheld device 240 obtaining the data upon which the display adjustments are based, and performing a given analysis, as noted above, in at least some exemplary embodiments, the data can be obtained at a location remote from the recipient, and thus the hearing prosthesis 100 and the portable handheld device 240. In such an exemplary embodiment, the system 210 can thus also include the remote location.

In this vein, it is again noted that the schematic of FIG. 10 is functional. In some embodiments, a system 1206 is a self-contained device (e.g., a laptop computer, a smart phone, etc.) that is configured to execute one or more or all of the method actions detailed herein and/or variations thereof. In an alternative embodiment, system 1206 is a system having components located at various geographical locations. By way of example only and not by way of limitation, user interface 1214 can be located with the recipient (e.g., it can be the portable handheld device 240) and the system controller (e.g., processor) 1212 can be located remote from the recipient. By way of example only and not by way of limitation, the system controller 1212 can communicate with the user interface 1214, and thus the portable handheld device 240, via the Internet and/or via cellular communication technology or the like. Indeed, in at least some embodiments, the system controller 1212 can also communicate with the user interface 1214 via the Internet and/or via cellular communication or the like. Again, in an exemplary embodiment, the user interface 1214 can be a portable communications device, such as, by way of example only and not by way of limitation, a cell phone and/or a so-called smart phone. Indeed, user interface 1214 can be utilized as part of a laptop computer or the like. Any arrangement that can enable system 1206 to be practiced and/or that can enable a system that can enable the teachings detailed herein and/or variations thereof to be practiced can be utilized in at least some embodiments.

In view of the above, FIG. 11 depicts an exemplary functional schematic, where the remote device 240 is in communication with a geographically remote device/facility 1000 via link 2230, which can be an internet link. The geographically remote device/facility 1000 can encompass controller 1212, and the remote device 240 can encompass the user interface 1214.

Accordingly, an exemplary embodiment entails executing some or all of the method actions detailed herein where the recipient of the hearing prosthesis, the hearing prosthesis 100 and/or the portable handheld device 240 is located remotely (e.g., geographically distant) from where at least some of the method actions detailed herein are executed.

In view of the above, it can be seen that in an exemplary embodiment, there is a portable handheld device, such as portable handheld device 240, comprising a cellular telephone communication suite (e.g., the phone architecture of a smartphone), and a hearing prosthesis functionality suite, (e.g., an application located on the architecture of a smartphone that enables applications to be executed that is directed towards the functionality of a hearing prosthesis) including a touchscreen display. In an exemplary embodiment, the hearing prosthesis functionality suite is configured to enable a recipient to adjust a feature of a hearing prosthesis, such as hearing prosthesis 100, remote from the portable handheld device 240 via the touchscreen display (e.g., by sending a signal via link 230 to the hearing prosthesis 100).

In an exemplary embodiment, the portable handheld device is configured to automatically analyze user use of the portable handheld device and present different hearing prosthesis functions on the display based on the automatic analysis, at least, in some exemplary embodiments, relative to that which would be the case in the absence of the analysis. Still further, in an exemplary embodiment, the portable handheld device is configured to automatically analyze user use of the portable handheld device and present different hearing prosthesis functions on the display, based on the automatic analysis that is different than that which was the case due to a prior analysis. In an exemplary embodiment, the contents of a given specific interface (e.g., a display of an application) is changed relative to that which was previously the case or otherwise would be the case, based on the aforementioned automatic analysis.

Some exemplary utilitarian values of such a feature can permit the system 210 to automatically adjust to the user's level of skill/competence/experience with the hearing prosthesis 100. For example, in an exemplary embodiment, the portable handheld device is configured to automatically present a novice prosthesis control display or an expert prosthesis control display different from the novice display based on the automatic analysis. In at least some exemplary embodiments, the novice display can be a display that has fewer options than the expert display. Alternatively and/or in addition to this, the novice display and limit or otherwise prevent the recipient from making certain changes, whereas the expert display can permit the recipient to make more changes/change different things that otherwise might not necessarily be able to be changed using the novice display.

Any device, system, and/or method of ascertaining the recipient's competence/comfort with respect to his or her utilization of the hearing prosthesis 100 can be utilized as a basis to change the content of the specific interface display/present different displays. In at least some exemplary embodiments, statistically significant data is utilized as the basis to determine what should and should not be displayed on a given display/what display should be displayed.

In some embodiments, the analysis of the user use corresponds to evaluating temporally weighted data based on at least one of a number of times that the user has changed a volume of the hearing prosthesis or the number of times that the user has changed maps of the hearing prosthesis. In an exemplary embodiment, the portable handheld device is configured to present at least one of a remote mapping display or a recommendation display based on the analysis of the user use.

Indeed, in an exemplary embodiment, any data that is indicative of a scenario where the hearing prosthesis 100 can be adjusted or otherwise controlled to operate in a more utilitarian manner can be data upon which a determination is made to present one or more of the aforementioned displays herein and/or variations thereof. In this regard, in an exemplary embodiment, the system 210 can be configured to determine whether or not a "tuneup" could be utilitarian, and present the corresponding displays on the display 242.

It is noted that in describing various teachings herein, various actions and/or capabilities have been attributed to various elements of the system 210. In this regard, any disclosure herein associated with a given functionality or capability of the hearing prosthesis 100 also corresponds to a disclosure of a remote device 240 (e.g., a portable handheld device) having that given functionality or capability providing that the art enable such and/or a disclosure of a geographically remote facility 1000 having that given functionality or capability providing that the art enable such. Corollary to this is that any disclosure herein associated with a given functionality or capability of the remote device 240 also corresponds to a disclosure of a hearing prosthesis 100 having that given functionality or capability providing that the art enable such and/or disclosure of a geographically remote facility 1000 having that given functionality or capability, again providing that the art enable such. As noted above, the system 210 can include the hearing prosthesis 100, the remote device 240, and the geographically remote device 1000.

It is further noted that the data upon which determinations are made or otherwise based with respect to the display of a given interface display can also correspond to data relating to a more generalized use of the system 210. In this regard, in some embodiments, the remote device 240 and/or the hearing prosthesis 100 can have a so-called caregiver mode, where the controls or data that is displayed can be more sophisticated relative to that which is the case for the normal control mode/the recipient control mode. By way of example only and not by way of limitation, if the recipient is a child or one having diminished faculties owing to age or ailment, the system 210 can have two or more modes. Accordingly, the data detailed herein can corresponds to input regarding which mode the system 210 is being operated in, and a given display can be presented based on that mode. For example, the caregiver display can have more sophisticated functionalities and/or the ability to adjust more features and/or present more data than the recipient mode. In an exemplary embodiment, a user can input into the remote device 240 a command indicating that the hearing prosthesis is to be operated in caregiver mode, and the displays presented thereafter caregiver mode displays, and these displays are presented until a command is entered indicating that the hearing prosthesis is to be operated in recipient mode, after which displays related to recipient mode are displayed (until a caregiver command is entered, etc.). That said, in an alternate embodiment, a caregiver and/or the recipient need not enter specific commands into system 210. In an exemplary embodiment, system 210 is configured to determine what mode it should be operated in. By way of example only and not by way of limitation, if a determination is made that the caregiver's voice has been received within a certain temporal period by the hearing prosthesis 100, the system 210 can enter the caregiver mode and present the given displays accordingly (where if the caregiver's voice is not been heard within a given period of time, the default is to a recipient control mode). Corollary to this is that in at least some exemplary embodiments, two or more remote devices 240 can be utilized in system 210, one of which is in the possession of the recipient, and another of which is in the possession of the caregiver. Depending on the data, various displays are presented for the various remote devices 240.

It is noted that while the teachings detailed herein up until now have been directed towards the utilization of a display to convey data to the recipient, in alternative embodiments, other data conveyance systems can be utilized. In this regard, by way of example only and not by way of limitation, in an exemplary embodiment, instead of and/or in addition to a display, the remote device is configured to provide an interface audio message to the recipient. In an exemplary embodiment, the interface audio message provided to the recipient presents data corresponding at least in part to that which would be displayed on a display according to any of the teachings detailed herein. In this regard, any disclosure herein related to the use of a display and or data conveyance via a display corresponds to a disclosure of a use of an audio output as a substitute and/or as a supplement to the use of the display, wherein the use of the audio output corresponds to providing data in an audio format corresponding at least in part to that which is provided by the display(s) as detailed herein.

In an exemplary embodiment, this embodiment is enabled using technologies corresponding to those that enable a text to speech system that synthesizes speech based on text words to enable a person to be exposed to data verbally as opposed to visually.

Thus, by way of example only and not by way of limitation, the remote device is configured to provide an interface audio message indicating the current volume setting of the hearing prosthesis and/or requesting input from the recipient regarding whether or not to change the volume and/or by how much the volume should be changed. Still further by way of example only and not by way of limitation, in an exemplary embodiment, the remote device is configured to provide an interface audio message indicating the current mixing ratio and/or requesting input from the recipient regarding whether or not to change the current mixing ratio and/or by how much the mixing ratio should be changed. That is, the interface audio messages provided by the remote device corresponds to the subject matter presented on the display except in audio instead of visual format.

Thus, in an exemplary embodiment, there is a system, such as system 210, that comprises a hearing prosthesis 100 including a stimulation device configured to be attached to a recipient and configured to evoke a hearing percept based on input, and a remote device including an output system, which output system can be a display and/or can be a system configured to provide an audio output (e.g., a speaker and/or a system in communication with the hearing prosthesis such that the remote device can provide a signal to the hearing prosthesis to evoke a hearing percept resulting in the audio output—it is noted that the output system can also include input functionality, as will be described below). In an exemplary embodiment, the remote device is a portable handheld device 240, or the aforementioned TV and/or monitor, etc., where the remote device is or is not configured to be portable, but where the remote device is configured to communicate with the hearing prosthesis. In an exemplary embodiment, the system is configured to analyze data relating to the hearing prosthesis. In an exemplary embodiment, the remote device is configured to receive data from the hearing prosthesis.

Still further, in an exemplary embodiment, the system is configured to provide an interface output from the output system from among a plurality of different interface outputs based on the analysis. In an exemplary embodiment, where, for example, the output system is a display, the interface output is an interface display displayed on the display from among a plurality of different interface displays based on the analysis. Still further, in an exemplary embodiment, the output system is instead and/or in addition to this (e.g., where the output system also includes the aforementioned display) configured to output an interface audio message, which interface audio message contains data corresponding at least in part to the data that would otherwise be conveyed by the display (or is conveyed in the case of embodiments that include a combined display and audio output).

With respect to the exemplary scenario detailed above, in an exemplary embodiment, the system 210 is configured to automatically present a first interface audio message superseding a prior interface audio message based on the data, the first interface audio message being a message requesting input from the recipient regarding whether to adjust a volume of the hearing prosthesis. In this regard, the remote device is configured to receive input from the recipient via a user interface (which can be the display and/or which can be buttons on the remote device and/or which can be a voice activated system of the remoted device via the use of a sound capture system such as a microphone) adjusting the volume of the hearing prosthesis, and the remote device is configured to output a signal to the hearing prosthesis instructing the hearing prosthesis to adjust the volume based on the input.

Still further, in an exemplary embodiment, the remote device is configured to automatically provide a second interface audio message superseding a prior interface audio message based on the data. In an exemplary embodiment, the second interface audio message is a message requesting input from the recipient regarding whether to adjust a hearing prosthesis adaptive functionality control. In this exemplary embodiment, the remote device is configured to receive input from the recipient via the user interface adjusting an adaptive functionality of the hearing prosthesis, and the remote device is configured to output a signal to the hearing prosthesis instructing the hearing prosthesis to adjust the adaptive functionality based on the input.

In at least some exemplary embodiments, the above functionality can have utilitarian value in that it can prioritize a given interface audio message without the recipient having to manually prompt (which includes verbal instructions) the portable handheld device 240 to provide an indication of a current setting or the like. In at least some exemplary embodiments, the aforementioned utility can entail, for example, allowing the recipient to audibly hear the current volume setting as it changes as he or she adjusts the volume of the hearing prosthesis 100 by adjusting the manual controls thereof (which also includes verbal instructions to the hearing prosthesis 100). In this regard, the portable handheld device 240 will automatically audibly output the current volume setting without the recipient having to prompt that output.

It is noted that the above exemplary scenario is also applicable to a scenario where the recipient adjusts a noise cancellation setting on the prosthesis 100, or any other adjustment on the hearing prosthesis 100 to which the teachings detailed herein and/or variations thereof are applicable.

Accordingly, in view of the above, disclosures of the use of a display herein correspond to a disclosure of an "audio display" where the displayed data is presented in an audible format instead of and/or in addition to a visual format.

Still further, any disclosure herein relating to the use of a display to convey data also corresponds to a disclosure of the use of a retina prosthesis or the like to present the data to the recipient. In at least some embodiments, any device, system and/or method of presenting data detailed herein can be utilized to enable the embodiments detailed herein.

It is noted that any method detailed herein also corresponds to a disclosure of a device and/or system configured to execute one or more or all of the method actions associated there with detailed herein. In an exemplary embodiment, this device and/or system is configured to execute one or more or all of the method actions in an automated fashion. That said, in an alternate embodiment, the device and/or system is configured to execute one or more or all of the method actions after being prompted by a human being. It is further noted that any disclosure of a device and/or system detailed herein corresponds to a method of making and/or using that the device and/or system, including a method of using that device according to the functionality detailed herein.

It is noted that embodiments include non-transitory computer-readable media having recorded thereon, a computer program for executing one or more or any of the method actions detailed herein. Indeed, in an exemplary embodiment, there is a non-transitory computer-readable media having recorded thereon, a computer program for executing at least a portion of any method action detailed herein.

It is further noted that any disclosure of a device and/or system detailed herein also corresponds to a disclosure of otherwise providing that device and/or system.

While various embodiments of the present invention have been described above, it should be understood that they have been presented by way of example only, and not limitation. It will be apparent to persons skilled in the relevant art that various changes in form and detail can be made therein without departing from the spirit and scope of the invention.

What is claimed is:

1. A system, comprising:
   a medical device including a stimulation device configured to be attached to a recipient and configured to stimulate the recipient based on input; and
   a remote device including an output system, the remote device being configured to communicate with the medical device, wherein
   the system is configured to analyze data relating to the medical device,
   the system is configured to provide an interface output from the output system from among a plurality of different interface outputs based on the analysis, thereby prioritizing the provided interface output without a user of the remote device having to prompt that interface output, and
   the data relating to the medical device is at least one of:
      data indicative of a type of data that is being inputted into the medical device;

data indicative of a source of data that is being inputted into the medical device;
data indicative of content of data that is being inputted into the medical device;
data indicative of a magnitude of a feature of data that is being inputted into the medical device;
data indicative of how the medical device is being used;
data indicative of how the medical device is currently configured; or
data indicative of an ambient environment of the medical device.

2. The system of claim 1, wherein the remote device is configured to automatically prioritize a first interface output superseding a prior interface output based on the data.

3. The system of claim 1, wherein:
the interface output is an interface audio message; and
the system is configured to provide the interface audio message from among a plurality of different interface audio messages based on the analysis.

4. The system of claim 1, wherein:
the interface output is an interface audio message;
the medical device is a hearing prosthesis;
the system is configured to provide the interface audio message from among a plurality of different interface audio messages based on the analysis;
the remote device is configured to automatically prioritize a first interface audio message superseding a prior interface audio message based on the data;
the stimulation of the recipient is stimulation that evokes a hearing percept; and
the remote device is configured to automatically provide a second interface audio message superseding a prior interface audio message based on the data, the second interface audio message requesting adjustment input from the recipient regarding whether to adjust a hearing prosthesis adaptive functionality control, wherein the remote device is configured to receive the adjustment input from the recipient via the user interface adjusting an adaptive functionality of the hearing prosthesis, and the remote device is configured to output a signal to the hearing prosthesis instructing the hearing prosthesis to adjust the adaptive functionality based on the adjustment input.

5. The system of claim 1, wherein the medical device is a hearing prosthesis and the stimulation of the recipient is stimulation that evokes a hearing percept and the remote device is configured to automatically present a first interface via the output system superseding a prior interface presented via the output system based on the data, the first interface having a hearing prosthesis volume control, wherein the remote device is configured to receive adjustment input from the recipient via the output system adjusting the volume of the hearing prosthesis, and the remote device is configured to output a signal to the hearing prosthesis instructing the hearing prosthesis to adjust the volume based on the adjustment input.

6. The system of claim 3, wherein the remote device is configured to automatically prioritize a first interface audio message superseding a prior interface audio message based on the data.

7. The system of claim 5, wherein the remote device is configured to automatically present a second interface via the output system superseding a prior interface presented via the output system based on the data, the second interface having a hearing prosthesis adaptive functionality control, wherein the remote device is configured to receive the adjustment input from the recipient via the output system adjusting an adaptive functionality of the hearing prosthesis, and the remote device is configured to output a signal to the hearing prosthesis instructing the hearing prosthesis to adjust the adaptive functionality based on the adjustment input.

8. The system of claim 6, wherein:
the medical device is a hearing prosthesis;
the interface output is an interface audio message;
the system is configured to provide the interface audio message from among a plurality of different interface audio messages based on the analysis;
the stimulation of the recipient is stimulation that evokes a hearing percept; and
the first interface audio message is a message indicating the current volume setting of the hearing prosthesis, wherein the remote device is configured to receive adjustment input from the recipient via a user interface adjusting the volume of the hearing prosthesis, and the remote device is configured to output a signal to the hearing prosthesis instructing the hearing prosthesis to adjust the volume based on the adjustment input.

9. The system of claim 1, wherein:
the medical device is configured to analyze the data; and
the remote device is configured to present an interface display via the output system from among a plurality of different interface displays based on a signal pertaining to the analyzed data received from the medical device.

10. The system of claim 9, wherein:
the remote device is also configured to analyze the data; and
the remote device is configured to present an interface display via the output system from among a plurality of different interface displays based on the analyzed data analyzed by the remote device.

11. The system of claim 1, wherein:
the medical device is a hearing prosthesis;
the stimulation of the recipient is stimulation that evokes a hearing percept;
the hearing prosthesis is a multimode hearing prosthesis;
the data is data indicative of the hearing prosthesis being utilized in one or more modes; and
the system is configured to automatically prioritize interface displays via the output system from among a plurality of different interface displays based on the received data.

12. The system of claim 11, wherein:
the multimode hearing prosthesis includes a first sub-system corresponding to a cochlear implant and a second sub-system configured to evoke a hearing percept based on a different principle of operation from that of the cochlear implant;
the system is configured to automatically present a first interface display via the output system prioritizing a set of controls for one of the first sub-system or the second sub-system upon an automatic determination by the system that the hybrid hearing prosthesis is being utilized in a first mode; and
the system is configured to automatically present a second interface display via the output system prioritizing a set of controls for the other of the first sub-system or the second sub-system upon an automatic determination by the system that the hybrid hearing prosthesis is being utilized in a second mode different from the first mode.

13. The system of claim 1, wherein:
the interface output is an interface audio message;
the system is configured to provide the interface audio message from among a plurality of different interface audio messages based on the analysis;
the medical device is a hearing prosthesis;
the stimulation of the recipient evokes a hearing percept; and
the first interface audio message is a message requesting adjustment input from the recipient regarding whether to adjust a volume of the hearing prosthesis, wherein the remote device is configured to receive the adjustment input from the recipient via a user interface adjusting the volume of the hearing prosthesis, and the remote device is configured to output a signal to the hearing prosthesis instructing the hearing prosthesis to adjust the volume based on the adjustment input.

14. The system of claim 1, wherein the medical device is a hearing prosthesis, and the output system is configured to also receive adjustment input from a recipient of the hearing prosthesis.

15. The system of claim 1, wherein:
the remote device is configured to obtain input from a source other than the medical device; and
the remote device includes a display and is configured to present an interface on the display from among a plurality of different interfaces based on the input from the source other than the medical device.

16. The system of claim 3, wherein:
the remote device is also configured to present an interface display via the output system from among a plurality of different interface displays based on the analysis.

17. The system of claim 9, wherein:
the remote device is also configured to analyze the data; and
the remote device is configured to present the interface display via the output system from among the plurality of different interface displays based on the analyzed data analyzed by the remote device.

18. The system of claim 15, wherein:
the remote device includes a speaker and is configured to present an interface using the speaker from among a plurality of different interfaces based on the input from the source other than the medical device.

19. The system of claim 9, wherein:
the presented interface display is a dynamic interface display.

20. The system of claim 9, wherein:
the presented interface display is a static interface display.

21. The system of claim 1, wherein:
the remote device is configured to control the medical device; and
the input is input from the remote device to control the medical device.

22. The system of claim 1, wherein:
the medical device is a totally implantable hearing prosthesis.

23. The system of claim 1, wherein:
the system is configured to present an interface display via the output system from among a plurality of different interface displays based on the analyzed data.

24. The system of claim 1, wherein:
the remote device is in wireless communication with an external component of the medical device, the external component being in transcutaneous wireless communication with the stimulating device.

25. The system of claim 1, wherein the data relating to the medical device is the data indicative of the type of data that is being inputted into the medical device.

26. The system of claim 1, wherein the data relating to the medical device is the data indicative of the source of data that is being inputted into the medical device.

27. The system of claim 1, wherein the data relating to the medical device is the data indicative of content of data that is being inputted into the medical device.

28. The system of claim 1, wherein the data relating to the medical device is the data indicative of a magnitude of a feature of data that is being inputted into the medical device.

29. The system of claim 1, wherein the data relating to the medical device is at least one of:
data indicative of how the medical device is being used; or
data indicative of how the medical device is currently configured.

30. The system of claim 1, wherein the data relating to the medical device is data indicative of the ambient environment of the medical device.

* * * * *